(12) United States Patent
Valcore, Jr. et al.

(10) Patent No.: US 10,231,321 B2
(45) Date of Patent: Mar. 12, 2019

(54) STATE-BASED ADJUSTMENT OF POWER AND FREQUENCY

(71) Applicant: Lam Research Corporation, Fremont, CA (US)

(72) Inventors: John C. Valcore, Jr., Fremont, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 354 days.

(21) Appl. No.: 14/918,492

(22) Filed: Oct. 20, 2015

(65) Prior Publication Data

US 2016/0044775 A1 Feb. 11, 2016

Related U.S. Application Data

(60) Division of application No. 13/620,386, filed on Sep. 14, 2012, now Pat. No. 9,197,196, which is a
(Continued)

(51) Int. Cl.
*H01J 37/32* (2006.01)
*H05H 1/46* (2006.01)
(Continued)

(52) U.S. Cl.
CPC ............... *H05H 1/46* (2013.01); *H02J 3/00* (2013.01); *H03J 7/00* (2013.01);
(Continued)

(58) Field of Classification Search
CPC ..... H01H 1/46; H02J 3/00; H05H 2001/4645; H05H 2001/4682; H03J 7/00; Y10T 307/718
See application file for complete search history.

(56) References Cited

U.S. PATENT DOCUMENTS 4,314,879 A 2/1982 Hartman et al.
4,353,777 A 10/1982 Jacob
(Continued)

FOREIGN PATENT DOCUMENTS

CN 101110347 A 1/2008
CN 101295345 A 10/2008
(Continued)

OTHER PUBLICATIONS

Han et al., "Power Accuracy and Source-Pull Effect for a High-Power RF Generator", Abstract, Jun. 16, 2006, 67th ARFTG Conference, San Francisco, CA, 2 pages.
(Continued)

*Primary Examiner* — Yuechuan Yu
(74) *Attorney, Agent, or Firm* — Penilla IP, APC

(57) ABSTRACT

Systems and methods for state-based adjustment of power and frequency are described. A primary generator of a system includes a primary power supply for supplying a primary radio frequency (RF) signal to an electrode. The primary generator further includes an automatic frequency control (AFC) to provide a first frequency input to the primary power supply when a pulsed signal is in a first state. A secondary generator of the system includes a secondary power supply for supplying a secondary RF signal to the electrode. The secondary generator also includes an AFC to provide a second frequency input to the secondary power supply when the pulsed signal is in the first state. The secondary generator includes an AFC to provide a third frequency input to the secondary power supply when the pulsed signal is in a second state. The system includes a digital pulsing source for generating the pulsed signal.

16 Claims, 13 Drawing Sheets

Related U.S. Application Data continuation-in-part of application No. 13/531,491, filed on Jun. 22, 2012, now Pat. No. 9,114,666.

(60) Provisional application No. 61/302,040, filed on Feb. 22, 2012.

(51) Int. Cl.
    *H03J 7/00*     (2006.01)
    *H02J 3/00*     (2006.01)

(52) U.S. Cl.
    CPC ............... *H05H 2001/4645* (2013.01); *H05H 2001/4682* (2013.01); *Y10T 307/718* (2015.04)

(56) References Cited

U.S. PATENT DOCUMENTS

| | | |
|---|---|---|
| 4,457,820 A | 7/1984 | Bergeron et al. |
| 5,053,725 A | 10/1991 | Gesche et al. |
| 5,084,239 A | 1/1992 | Moulton et al. |
| 5,202,623 A | 4/1993 | LePage |
| 5,244,629 A | 9/1993 | Caputo et al. |
| 5,254,237 A * | 10/1993 | Snaper ............... C23C 14/0611 204/192.38 |
| 5,303,139 A | 4/1994 | Mark |
| 5,571,366 A | 11/1996 | Ishii et al. |
| 5,645,796 A | 7/1997 | Caputo et al. |
| 5,654,043 A | 8/1997 | Shao et al. |
| 5,917,286 A | 6/1999 | Scholl et al. |
| 5,989,999 A | 11/1999 | Levine et al. |
| 6,157,867 A | 12/2000 | Hwang et al. |
| 6,222,321 B1 | 4/2001 | Scholl et al. |
| 6,287,980 B1 | 9/2001 | Hanazaki et al. |
| 6,351,683 B1 | 2/2002 | Johnson et al. |
| 6,372,654 B1 | 4/2002 | Tokashiki |
| 6,431,112 B1 | 8/2002 | Sill et al. |
| 6,441,555 B1 | 8/2002 | Howald et al. |
| 6,441,620 B1 | 8/2002 | Scanlan et al. |
| 6,781,317 B1 | 8/2004 | Goodman |
| 7,361,287 B2 | 4/2008 | Laermer |
| 7,586,100 B2 | 9/2009 | Raj et al. |
| 7,589,473 B2 | 9/2009 | Suslov |
| 7,718,538 B2 | 5/2010 | Kim et al. |
| 7,737,042 B2 | 6/2010 | Kim et al. |
| 7,764,140 B2 | 7/2010 | Nagarkatti et al. |
| 7,771,606 B2 | 8/2010 | Kim et al. |
| 8,030,849 B2 | 10/2011 | Suslov |
| 8,053,991 B2 | 11/2011 | Kim et al. |
| 8,103,492 B2 | 1/2012 | Brcka |
| 8,297,540 B1 | 10/2012 | Vijay |
| 8,471,484 B2 | 6/2013 | Watanabe et al. |
| 8,609,546 B2 | 12/2013 | Lee et al. |
| 8,679,358 B2 | 3/2014 | Nakagawa |
| 8,692,467 B2 | 4/2014 | Benjamin et al. |
| 8,808,561 B2 | 8/2014 | Kanarik |
| 8,872,429 B2 | 10/2014 | Rosener |
| 8,883,028 B2 | 11/2014 | Kanarik |
| 8,901,004 B2 | 12/2014 | Kamp et al. |
| 8,906,196 B2 | 12/2014 | Nishio |
| 9,076,646 B2 | 7/2015 | Sims et al. |
| 2002/0096257 A1 | 7/2002 | Wang et al. |
| 2002/0132380 A1 | 9/2002 | Nakano et al. |
| 2002/0157608 A1 | 10/2002 | Nakano et al. |
| 2003/0119308 A1 | 6/2003 | Geefay et al. |
| 2003/0153989 A1 | 8/2003 | Scalan et al. |
| 2004/0004708 A1 | 1/2004 | Willis |
| 2004/0124077 A1 | 7/2004 | Christie |
| 2004/0154540 A1 | 8/2004 | Hayami et al. |
| 2004/0259276 A1 | 12/2004 | Yue et al. |
| 2005/0034811 A1 | 2/2005 | Mahoney et al. |
| 2005/0039682 A1 | 2/2005 | Dhindsa et al. |
| 2005/0055868 A1 | 3/2005 | Ratte |
| 2005/0057165 A1 | 3/2005 | Goodman |
| 2005/0067386 A1 | 3/2005 | Mitrovic |
| 2005/0205532 A1 | 9/2005 | Patrick et al. |
| 2005/0234574 A1 | 10/2005 | Lam et al. |
| 2005/0283321 A1 | 12/2005 | Yue et al. |
| 2006/0005928 A1 | 1/2006 | Howald et al. |
| 2006/0054596 A1 | 3/2006 | Howard |
| 2006/0066248 A1 | 3/2006 | Chistyakov |
| 2006/0081558 A1 | 4/2006 | Collins et al. |
| 2006/0081564 A1 | 4/2006 | Moroz et al. |
| 2006/0267504 A1 | 11/2006 | VanDrie et al. |
| 2006/0278608 A1 | 12/2006 | Hoffman |
| 2007/0095788 A1 | 5/2007 | Hoffman et al. |
| 2007/0127188 A1 | 6/2007 | Yang et al. |
| 2007/0284246 A1 | 12/2007 | Keil et al. |
| 2008/0029385 A1 | 2/2008 | Koshimizu et al. |
| 2008/0050537 A1 | 2/2008 | Godyak |
| 2008/0074255 A1 | 3/2008 | Park et al. |
| 2008/0237031 A1 | 10/2008 | Sato |
| 2008/0241016 A1 | 10/2008 | Kato et al. |
| 2009/0105980 A1 | 4/2009 | Tetsuka et al. |
| 2009/0210181 A1 | 8/2009 | Swank |
| 2009/0255800 A1 | 10/2009 | Koshimizu |
| 2009/0294061 A1 | 12/2009 | Shannon et al. |
| 2009/0294414 A1 | 12/2009 | Shannon et al. |
| 2009/0308734 A1 | 12/2009 | Krauss |
| 2010/0039747 A1 | 2/2010 | Sansoni et al. |
| 2010/0136793 A1 | 6/2010 | Chen et al. |
| 2010/0248488 A1 | 9/2010 | Agarwal et al. |
| 2010/0314048 A1 | 12/2010 | Long et al. |
| 2010/0330299 A1 * | 12/2010 | Moon ............... C23C 16/24 427/569 |
| 2010/0332201 A1 | 12/2010 | Albarede et al. |
| 2011/0062014 A1 | 3/2011 | Gutsol et al. |
| 2012/0000887 A1 | 1/2012 | Eto et al. |
| 2012/0052689 A1 | 3/2012 | Tokashiki |
| 2012/0160806 A1 | 6/2012 | Godyak et al. |
| 2012/0187844 A1 | 7/2012 | Hoffman et al. |
| 2012/0227484 A1 | 9/2012 | Chen et al. |
| 2012/0262064 A1 | 10/2012 | Nagarkatti et al. |
| 2013/0009545 A1 | 1/2013 | Benjamin et al. |
| 2013/0050892 A1 | 2/2013 | Kuthi et al. |
| 2013/0105443 A1 | 5/2013 | Banna et al. |
| 2013/0119019 A1 | 5/2013 | Kanarik et al. |
| 2013/0168354 A1 | 7/2013 | Kanarik |
| 2013/0180951 A1 | 7/2013 | Indrakanti et al. |
| 2014/0062303 A1 | 3/2014 | Hoffman et al. |
| 2014/0066838 A1 | 3/2014 | Hancock |
| 2014/0076713 A1 | 3/2014 | Valcore, Jr. et al. |
| 2014/0167613 A1 | 6/2014 | Fong et al. |
| 2014/0172335 A1 | 6/2014 | Valcore, Jr. et al. |
| 2014/0305589 A1 | 10/2014 | Valcore, Jr. et al. |
| 2015/0002018 A1 | 1/2015 | Lill et al. |
| 2015/0020971 A1 | 1/2015 | Kanarik |

FOREIGN PATENT DOCUMENTS

| | | |
|---|---|---|
| JP | 2002-063999 | 2/2002 |
| JP | 2003-282545 | 10/2003 |
| JP | 2011172410 A | 1/2011 |
| TW | 201038143 A | 10/2010 |
| WO | 1999014699 A1 | 3/1999 |
| WO | 2014070838 A1 | 5/2014 |

OTHER PUBLICATIONS

Han et al., "Power Accuracy and Source-Pull Effect for a High-Power RF Generator", Jun. 16, 2006, 67th ARFTG Conference, San Francisco, CA, pp. 81-92, 12 pages.

Yang et al., "Real-Time Fault Classification for Plasma Processes", Jul. 6, 2011, Sensors 2011, 11(7), pp. 7037-7054 (18 pages).

Christoph Steuer, TOOL Comparison at GC Stack Etch in LAM TCP Using Plasma Parameters (SEERS), Dec. 12, 2000, 2nd workshop on self excited electron plasma resonance spectroscopy, Dresden, Germany.

Lars Christoph, Comparison of Applied Materials DPS Chambers used for poly-Si Etch process by Plasma Parameters, Dec. 6, 2000,

(56) References Cited

OTHER PUBLICATIONS

2nd workshop on self excited electron plasma resonance spectroscopy, Dresden, Germany.

* cited by examiner

STATE-BASED ADJUSTMENT OF POWER AND FREQUENCY

CLAIM OF PRIORITY

The present patent application is a divisional of and claims the benefit of and priority, under 35 U.S.C. § 120, to U.S. patent application Ser. No. 13/620,386, filed on Sep. 14, 2012, and titled "State-based Adjustment of Power and Frequency", which is incorporated by reference herein in its entirety for all purposes.

The U.S. patent application Ser. No. 13/620,386 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The U.S. patent application Ser. No. 13/620,386 is a continuation-in-part of and claims the benefit of and priority, under 35 U.S.C. § 120, to U.S. patent application Ser. No. 13/531,491, filed on Jun. 22, 2012, now issued as U.S. Pat. No. 9,114,666, and titled "Methods and Apparatus For Controlling Plasma In A Plasma Processing System", which is incorporated by reference herein in its entirety.

CROSS-REFERENCE TO RELATED APPLICATIONS

The present patent application is related to U.S. patent application Ser. No. 13/666,912, filed on Nov. 1, 2012.

FIELD

The present embodiments relate to improving response time to a change in plasma impedance, and more particularly, apparatus, methods, and computer programs for state-based adjustment of power and frequency.

BACKGROUND

In some plasma processing systems, multiple radio frequency (RF) signals are provided to one or more electrodes within a plasma chamber. The RF signals help generate plasma within the plasma chamber. The plasma is used for a variety of operations, e.g., clean substrate placed on a lower electrode, etch the substrate, etc.

Between an RF supply that generates an RF signal and the plasma chamber, an impedance matching circuit is usually placed. The impedance matching circuit matches an impedance of a load, e.g., plasma within the plasma chamber, with an impedance of a source, e.g., an RF power supply. However, in certain situations, the impedance matching is not quick enough to respond to a change in the plasma impedance.

It is in this context that embodiments described in the present disclosure arise.

SUMMARY

Embodiments of the disclosure provide apparatus, methods and computer programs for state-based adjustment of power and frequency. It should be appreciated that the present embodiments can be implemented in numerous ways, e.g., a process, an apparatus, a system, a device, or a method on a computer readable medium. Several embodiments are described below.

In an embodiment, with a change in state of a digital pulsing signal, power and/or frequencies of RF signals generated by multiple RF sources are changed. For example, when a state of the digital pulsing signal is S1, a first RF source generates a power signal having a first power value and a first frequency and a second RF source generates a power signal having a second power value and a second frequency. The reception of the state S1 triggers the generation of the power signal with the first power value and with the first frequency and the generation of the power signal with the second power value and with the second frequency. In this example, when a state of the digital pulsing signal is S0, the first RF source generates a power signal having a third power value and a third frequency, which may or may not be the same as the first frequency. Moreover, in this example, when a state of the digital pulsing signal is S0, the second RF source generates a power signal having a fourth power value and a fourth frequency, which may or may not be the same as the second frequency. The reception of the state S0 triggers the generation of the power signal with the third power value and with the third frequency and the generation of the power signal with the fourth power value and with the fourth frequency. The triggering results in less response time for responding to a change in plasma impedance within a plasma chamber. In one embodiment, the second and fourth power values are same.

In an embodiment, a system includes a primary generator coupled to an electrode. The primary generator includes a primary power supply for supplying a primary radio frequency (RF) signal to the electrode. The primary generator further includes an automatic frequency control (AFC) to provide a first frequency input to the primary power supply when a pulsed signal is in a first state. The system also includes a secondary generator coupled to the electrode. The secondary generator includes a secondary power supply for supplying a secondary RF signal to the electrode. The secondary generator also includes an AFC to provide a second frequency input to the secondary power supply when the pulsed signal is in the first state. The secondary generator includes an AFC to provide a third frequency input to the secondary power supply when the pulsed signal is in a second state. The system includes a digital pulsing source for generating the pulsed signal.

In one embodiment, a system includes a plasma chamber that further includes a lower electrode with a surface for supporting a substrate. The plasma chamber includes an upper electrode disposed over the lower electrode. The upper electrode is electrically grounded. The system includes a primary generator coupled to the lower electrode. The primary generator includes a primary power supply for supplying a primary radio frequency (RF) signal to the lower electrode. The system also includes a secondary generator coupled to the lower electrode. The secondary generator includes a secondary power supply for supplying a secondary RF signal to the lower electrode. The system includes a digital pulsing source for generating a pulsed signal. The digital pulsing source is coupled to the primary generator and the secondary generator. The primary generator includes a first automatic frequency control (AFC) to provide a first frequency input to the primary power supply when the pulsed signal is in a first state. The secondary generator includes a second AFC to provide a second frequency input to the secondary power supply when the pulsed signal is in the first state. Moreover, the secondary generator includes a third AFC to provide a third frequency input to the secondary power supply when the pulsed signal is in the second state.

In an embodiment, a system includes a digital pulsing source for generating a pulsed signal. The system further includes a primary generator. The primary generator includes a primary power supply coupled to an electrode for supplying a primary radio frequency (RF) signal to the electrode. The primary generator includes a primary processor coupled to the pulsing source for receiving the pulsed signal. The primary processor is used for identifying a first one of two states of the pulsed signal and a second one of the two states. The primary generator also includes a power controller coupled to the primary processor to determine whether to provide a primary power value to the primary power supply based on whether the pulsed signal is in the first state or the second state. The primary generator includes an automatic frequency control (AFC) coupled to the primary processor to receive the state identification from the primary processor. The AFC is configured to provide a frequency of the primary RF signal when the pulsed signal is in the first state.

In this embodiment, the system further includes a secondary generator. The secondary generator includes a secondary power supply coupled to the electrode for supplying a secondary RF signal to the electrode. The secondary generator includes a secondary processor coupled to the pulsing source for receiving the pulsed signal to identify whether the pulsed signal is in the first state or the second state. The secondary generator also includes a first power controller coupled to the secondary processor to provide a first secondary power value to the secondary power supply when the pulsed signal is in the first state. The secondary generator includes a second power controller coupled to the secondary processor to provide a second secondary power value to the secondary power supply when the pulsed signal is in the second state. The secondary generator further includes a first AFC coupled to the secondary processor to receive the state identification from the secondary processor. The first AFC is configured to provide a first frequency input of the secondary RF signal when the pulsed signal is in the first state. The secondary generator includes a second AFC coupled to the secondary processor to receive the state identification from the secondary processor. The second AFC is configured to provide a second frequency input of the secondary RF signal when the pulsed signal is in the second state.

In an embodiment, a system includes a plasma chamber that further includes a lower electrode with a surface for supporting a substrate. The plasma chamber includes an upper electrode disposed over the lower electrode. The upper electrode is electrically grounded. The system includes a digital pulsing source for generating a pulsed signal that transitions between two states. The system further includes a primary generator. The primary generator includes a primary power supply coupled to the lower electrode for supplying a primary radio frequency (RF) signal to the lower electrode. The primary generator further includes a primary processor coupled to the pulsing source for receiving the pulsed signal. The primary processor is used for identifying a first one of the two states and a second one of the two states of the pulsed signal. The primary generator also includes a power controller coupled to the primary processor to determine whether to provide a primary power value to the primary power supply based on whether the pulsed signal is in the first state or the second state. The primary generator includes an automatic frequency control (AFC) coupled to the primary processor to receive the state identification from the primary processor. The AFC is configured to provide a frequency of the primary RF signal when the pulsed signal is in the first state.

In this embodiment, the system further includes a secondary generator that includes a secondary power supply coupled to the lower electrode for supplying a secondary RF signal to the lower electrode. The secondary generator includes a secondary processor coupled to the digital pulsing source for receiving the pulsed signal to identify whether the pulsed signal is in the first state or the second state. The secondary generator further includes a first power controller coupled to the secondary processor to provide a first secondary power value to the secondary power supply when the pulsed signal is in the first state. The secondary generator also includes a second power controller coupled to the secondary processor to provide a second secondary power value to the secondary power supply when the pulsed signal is in the second state. The secondary generator includes a first AFC coupled to the secondary processor to receive the state identification from the secondary processor. The first primary AFC is configured to provide a frequency of the secondary RF signal when the pulsed signal is in the first state. The secondary generator includes a second AFC coupled to the secondary processor to receive the state identification from the secondary processor. The second AFC is configured to provide a frequency of the secondary RF signal when the pulsed signal is in the second state.

In one embodiment, a system includes a digital pulsing source for generating a pulsed signal. The system includes a primary generator. The primary generator also includes a primary power supply coupled to an electrode for supplying a primary radio frequency (RF) signal to the electrode. The primary generator includes a primary processor coupled to the digital pulsing source for receiving the pulsed signal. The primary processor is used for identifying a first one of two states of the pulsed signal and a second one of the two states. The primary generator includes a first primary power controller coupled to the primary processor to provide a first primary power value to the primary power supply when the pulsed signal is in the first state. The primary generator also includes a second primary power controller coupled to the primary processor to provide a second primary power value to the primary power supply when the pulsed signal is in the second state. The primary generator includes a first primary automatic frequency control (AFC) coupled to the primary processor to receive the state identification from the primary processor. The first primary AFC is configured to provide a first primary frequency input to the primary RF signal when the pulsed signal is in the first state. The primary generator includes a second primary AFC coupled to the primary processor to receive the state identification from the primary processor. The second primary AFC is configured to provide a second primary frequency input to the primary RF signal when the pulsed signal is in the second state.

In this embodiment, the system includes a secondary generator. The secondary generator includes a secondary power supply coupled to the electrode for supplying a secondary RF signal to the electrode. The secondary generator further includes a secondary processor coupled to the digital pulsing source for receiving the pulsed signal to identify whether the pulsed signal is in the first state or the second state. The secondary generator includes a first secondary power controller coupled to the secondary processor to provide a first secondary power value to the secondary power supply when the pulsed signal is in the first state. The secondary generator includes a second secondary power controller coupled to the secondary processor to provide a second secondary power value to the secondary power supply when the pulsed signal is in the second state. The secondary generator includes a first secondary AFC coupled to the secondary processor to receive the state identification from the secondary processor. The first secondary AFC is configured to provide a first secondary frequency input to the secondary RF signal when the pulsed signal is in the first state. The secondary generator includes a second secondary AFC coupled to the secondary processor to receive the state identification from the secondary processor. The second secondary AFC is configured to provide a second secondary frequency input to the secondary RF signal when the pulsed signal is in the second state.

In one embodiment, a system includes a plasma chamber that includes a lower electrode with a surface for supporting a substrate. The plasma chamber includes an upper electrode disposed over the lower electrode. The upper electrode is electrically grounded. The system includes a digital pulsing source for generating a pulsed signal. The pulsed signal transitions between two states. The system includes a primary generator. The primary generator includes a primary power supply coupled to the lower electrode for supplying a primary radio frequency (RF) signal to the lower electrode. The primary generator further includes a primary processor coupled to the digital pulsing source for receiving the pulsed signal. The primary processor is used for identifying a first one of the two states and a second one of the two states of the pulsed signal. The primary generator includes a first primary power controller coupled to the primary processor to provide a first primary power value to the primary power supply when the pulsed signal is in the first state. The primary generator further includes a second primary power controller coupled to the primary processor to provide a second primary power value to the primary power supply when the pulsed signal is in the second state. The primary generator also includes a first primary automatic frequency control (AFC) coupled to the primary processor to receive the state identification from the primary processor. The first AFC is configured to provide a frequency of the primary RF signal when the pulsed signal is in the first state. The primary generator includes a second primary AFC coupled to the primary processor to receive the state identification from the primary processor. The second primary AFC is configured to provide a frequency of the primary RF signal when the pulsed signal is in the second state.

In this embodiment, the system includes a secondary generator that further includes a secondary power supply coupled to the lower electrode for supplying a secondary RF signal to the lower electrode. The secondary generator includes a secondary processor coupled to the digital pulsing source for receiving the pulsed signal to identify whether the pulsed signal is in the first state or the second state. The secondary generator further includes a first secondary power controller coupled to the secondary processor to provide a first secondary power value to the secondary power supply when the pulsed signal is in the first state. The secondary generator includes a second secondary power controller coupled to the secondary processor to provide a second secondary power value to the secondary power supply when the pulsed signal is in the second state. The secondary generator further includes a first secondary AFC coupled to the secondary processor to receive the state identification from the secondary processor. The first secondary AFC is configured to provide a frequency of the secondary RF signal when the pulsed signal is in the first state. The secondary generator includes a second secondary AFC coupled to the secondary processor to receive the state identification from the secondary processor. The second secondary AFC is configured to provide a frequency of the secondary RF signal when the pulsed signal is in the second state.

In an embodiment, a method includes receiving a digital pulsing signal. The digital pulsing signal has two states. The method further includes switching from applying a first frequency input to a primary RF power supply when the digital pulsing signal is in a first one of the two states to applying a second frequency input to the primary RF power supply when the digital pulsing signal is in a second one of the two states. The method includes determining a third frequency input to apply to a secondary RF power supply when the digital pulsing signal is in the first state.

Some advantages of the above-described embodiments include reducing a response time to respond to a change in plasma impedance within a plasma chamber. For example, when a state signal, e.g., a transistor-transistor logic (TTL) signal, etc., is used to control frequency and/or power supplied by multiple RF power supplies, a first one of the RF supplies does not need time to respond to change in power and/or frequency of a second one of the RF supplies. Usually, when the frequency and/or power input to the first RF supply is changed, there is a change in plasma impedance and the first RF supply reacts to the change in the impedance. This reaction takes time, which negatively affects a process, e.g., etching, deposition, cleaning, etc., occurring within the plasma chamber. When the RF supplies react to a change in the state of the state signal with pre-determined frequencies and/or pre-determined power, the time to react to the change in plasma impedance is reduced. This reduction in time results in a reduction in time to negative affect the process.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for state-based adjustment of power and frequency. It will be apparent that the present embodiments may be practiced without some or all of these specific details. In other instances, well known process operations have not been described in detail in order not to unnecessarily obscure the present embodiments.

Figure 1:
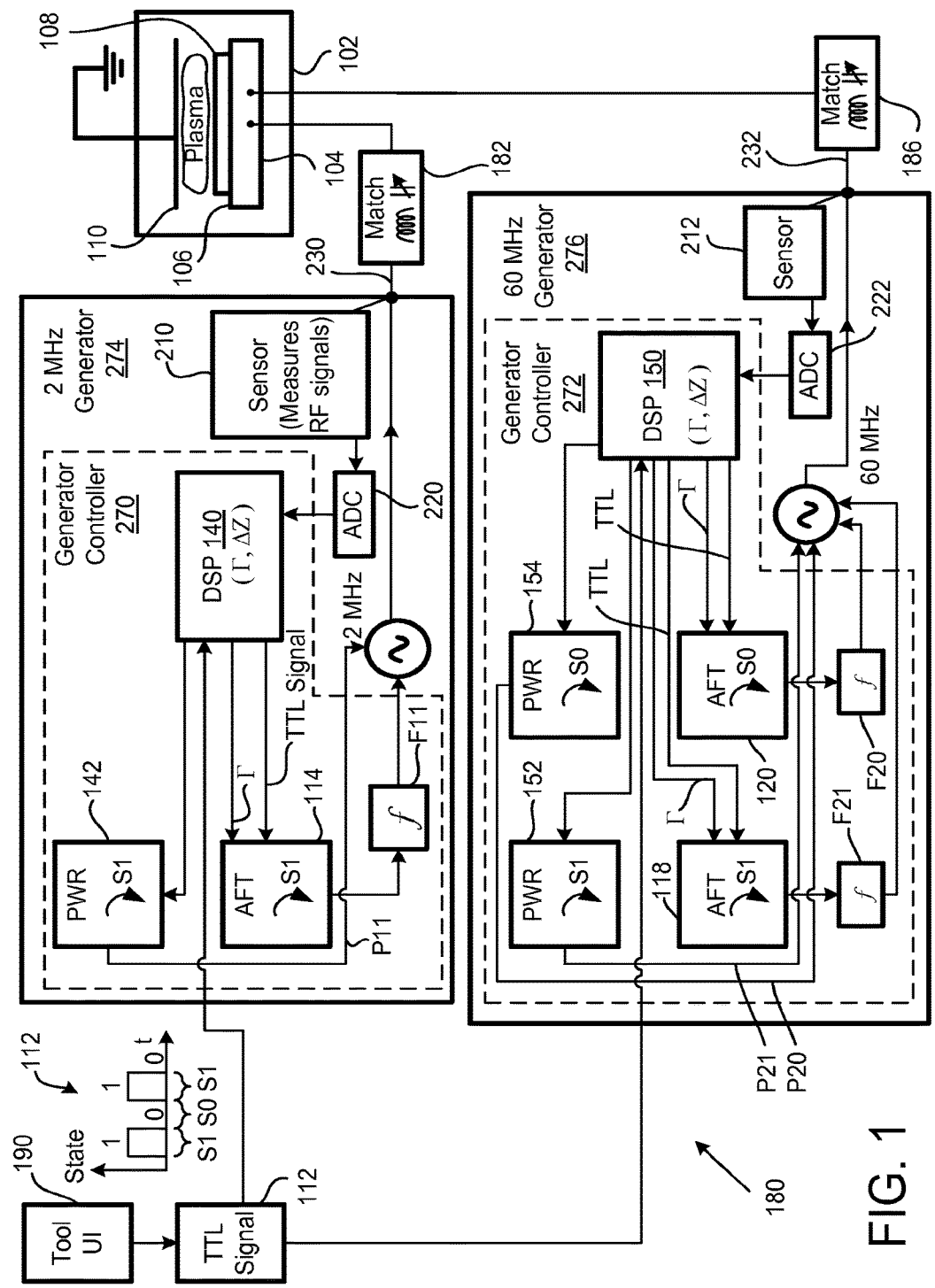
FIG. 1 is a block diagram of a system for reducing an amount of time to tune power controllers and/or frequency tuners according to a change in plasma impedance, in accordance with an embodiment described in the present disclosure.

FIG. 1 is a block diagram of an embodiment of a system 180 for reducing an amount of time to tune power controllers and/or frequency tuners according to a change in plasma impedance. A 2 megahertz (MHz) radio frequency (RF) power supply supplies RF power via an impedance matching circuit 182 to a lower electrode 104 of a plasma chamber 102. Similarly, a 60 MHz power supply supplies RF power via an impedance matching circuit 186 to the lower electrode 104. It should be noted that in one embodiment, instead of the 60 MHz source, a 27 MHz source is used to provide RF power to the lower electrode 104. Moreover, it should be noted that the values 2 MHz, 27 MHz, and 60 MHz are provided as examples and are not limiting. For example, instead of the 2 MHz power supply, a 2.5 MHz power supply may be used and instead of the 60 MHz power supply, a 65 MHz power supply may be used. In another embodiment, in addition to the 2 MHz source and the 60 MHz sources, the 27 MHz source is used to provide RF power to the lower electrode 104.

An impedance matching circuit includes electric circuit components, e.g., inductors, capacitors, etc. to match an impedance of a power source coupled to the impedance matching circuit with an impedance of a load coupled to the impedance matching circuit. For example, the impedance matching circuit 182 matches an impedance of the 2 MHz power supply with an impedance of plasma generated within the plasma chamber 102. As another example, the impedance matching circuit 186 matches an impedance of the 60 MHz power supply with an impedance of plasma generated within the plasma chamber 102. As yet another example, the impedance matching circuit 182 matches an impedance of the 2 MHz power supply with an impedance of a portion, e.g., the plasma and the lower electrode 104, of the plasma chamber 102. In one embodiment, an impedance matching circuit is tuned to facilitate a match between an impedance of an RF power supply coupled to the impedance matching circuit and an impedance of a first load. An impedance match between a power source and a load reduces chances of power being reflected from the load towards the power source.

The plasma chamber 102 includes the lower electrode 104, an upper electrode 110, and other components (not shown), e.g., an upper dielectric ring surrounding the upper electrode 110, a lower electrode extension surrounding the upper dielectric ring, a lower dielectric ring surrounding the lower electrode, a lower electrode extension surrounding the lower dielectric ring, an upper plasma exclusion zone (PEZ) ring, a lower PEZ ring, etc. The upper electrode 110 is located opposite to and facing the lower electrode 104. A substrate 108, e.g., a semiconductor wafer, is supported on an upper surface 106 of the lower electrode 104. Integrated circuits, e.g., application specific integrated circuit (ASIC), programmable logic device (PLD), etc. are developed in the substrate 108 and the integrated circuits are used in a variety of devices, e.g., cell phones, tablets, smart phones, computers, laptops, networking equipment, etc. The lower electrode 104 is made of a metal, e.g., anodized aluminum, alloy of aluminum, etc. Also, the upper electrode 110 is made of a metal, e.g., aluminum, alloy of aluminum, etc.

In one embodiment, the upper electrode 110 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 110 is grounded. The lower electrode 104 is coupled to the 2 MHz RF power supply via the impedance matching circuit 182 and to the 60 MHz RF power supply via the impedance matching circuit 186.

When the process gas is supplied between the upper electrode 110 and the lower electrode 104 and when a power supply, e.g., the 2 MHz power supply and/or the 60 MHz power supply, supplies power via a corresponding impedance matching circuit to the lower electrode 104, the process gas is ignited to generate plasma within the plasma chamber 102. For example, the 2 MHz supply supplies power via the impedance matching circuit 182 to ignite the process gas to generate plasma.

A tool user interface (UI) 190 on a computer (not shown) is used to generate a transistor-transistor logic (TTL) signal 112, which is a digital pulsing signal. In one embodiment, the computer includes a TTL circuit. As used herein, instead of a computer, a processor, a controller, an ASIC, or a PLD is used, and these terms are used interchangeably herein. The TTL signal 112 includes states S1 and S0. The TTL signal 112 has a 50% duty cycle. In one embodiment, the TTL signal 112 has a duty cycle ranging from 5% to 95%. An example of the state S1 includes an on state, a state having a value of 1, or a high state. An example of the state S0 includes an off state, a state having a value of 0, or a low state. The high value is greater than the low value.

In another embodiment, instead of the computer, a clock oscillator, e.g., a crystal oscillator, is used to generate an analog clock signal, which is converted by an analog-to-digital converter into a digital signal similar to the TTL signal 112. For example, a crystal oscillator is made to oscillate in an electric field by applying a voltage to an electrode near or on the crystal oscillator.

The TTL signal 112 is sent to a digital signal processor (DSP) 140 and another DSP 150. Each DSP 140 and 150 receives the TTL signal 112 and identifies the states S0 and S1 of the TTL signal 112. For example, the DSP 140 distinguishes between the states S0 and S1. As another example, the DSP 140 determines that the TTL signal 112 has a first magnitude during a first set of time periods and has a second magnitude during a second set of time periods. The DSP 140 determines that the TTL signal 112 has the state S1 during the first set of time periods and has the state S0 during the second set of time periods. As yet another example, the DSP 140 compares a magnitude of the TTL signal 112 with a pre-stored value to determine that the magnitude of the TTL signal 112 is greater than the pre-stored value during the first set of time periods and that the magnitude during the state S0 of the TTL signal 112 is not greater than the pre-stored value during the second set of time periods. In the embodiment in which the clock oscillator is used, each DSP 140 and 150 receives an analog clock signal from the clock oscillator, converts the analog signal into a digital form, and then identifies the two states S0 and S1.

Each DSP 140 and 150 stores the states S0 and S1 in memory locations of one or more memory devices within the DSP. Examples of a member device include a random access memory (RAM) and a read-only memory (ROM). A memory device may be a flash memory, a hard disk, a storage device, a computer-readable medium, etc.

Each DSP 140 and 150 provides the identified states S0 and S1 from corresponding memory locations to corresponding auto frequency tuners (AFTs) 114, 118, and 120, and to corresponding power controllers 142, 152, and 154. For example, the DSP 140 indicates to the AFT 114 and the power controller 142 that the TTL signal 112 is in the state S1 between times t1 and t2 of a duty cycle. As another example, the DSP 150 indicates to the AFT 118 and the power controller 152 that the TTL signal 112 is in the state S1 between times t1 and t2 of a duty cycle. As yet another example, the DSP 150 indicates to the AFT 120 and the power controller 154 that the TTL signal 112 is in the state S0 between times t2 and t3 of a duty cycle. The terms tuner and controller are used interchangeably herein. An example of an AFT is provided in U.S. Pat. No. 6,020,794, which is incorporated by reference herein in its entirety.

Each AFT 114, 118, and 120 determines a frequency value based on a state of the TTL signal 112 and each power controller 142, 152, and 154 determines a power value based on the state of the TTL signal 112. For example, the AFT 114 determines that a frequency value F11 is to be provided to the 2 MHz power supply when the state of the TTL signal 112 is S1 and the power controller 142 determines that a power value P11 is to be provided to the 2 MHz power supply when the state of the TTL signal 112 is S1. As another example, the AFT 118 determines that a frequency value F21 is to be provided to the 60 MHz power supply when the state of the TTL signal 112 is S1 and that a frequency value F20 is to be provided to the 60 MHz power supply when the state of the TTL signal 112 is S0. As yet another example, the power controller 150 determines that a power value P20 is to be provided to the 60 MHz power supply when the state of the TTL signal 112 is S0 and that a power value P21 is to be provided to the 60 MHz power supply when the state of the TTL signal 112 is S1.

In one embodiment, the frequency value F21 and the power value P21 are generated based on a training routine. During the training routine, when the 2 MHz power supply changes its RF power signal from a low power value to a high power value, there is an impedance mismatch between one or more portions within the plasma chamber 102 and 60 MHz power supply. The high power value is higher than the low power value. The 2 MHz power supply changes its RF power signal when a state of the TTL signal 112 or a clock signal supplied to the 2 MHz RF power supply changes from S0 to S1. In this case, the 60 MHz power supply has its frequency and power tuned when the 2 MHz power supply starts supplying power at the high power value. To reduce the impedance mismatch, the 60 MHz power supply starts tuning, e.g., converging, to a frequency value and to a power value. The convergence may be determined by the DSP 150 based on a standard deviation or another technique. To allow the 60 MHz power supply more time to converge to the frequency value and the power value, the 2 MHz power supply is kept at the high power value for an extended period of time than a usual period of time. The usual period of time is an amount of time in which the impedance mismatch is not reduced, e.g., removed. An example of the usual period of time is equal to half cycle of the TTL signal 112. When the 60 MHz power supply converges to the frequency value and the power value, the converged frequency value is stored as the frequency value F21 within the AFT 118 and the converged power value is stored as the power value P21 within the power controller 152. Similarly, during the training routine, the frequency values F20 and F11 and the power values P11 and P20 are generated. The frequency value F20 is stored in the AFT 120, the frequency value F11 is stored in the AFT 114, the power value P11 is stored in the power controller 142, and the power value P20 is stored in the power controller 154.

When the state of the TTL signal 112 is S1, the power controller 142 provides the power value of P11 to the 2 MHz power supply and the power controller 152 provides the power value of P21 to the 60 MHz controller. During the state S1, the AFT 114 provides the frequency value of F11 to the 2 MHz power supply and the AFT 118 provides the frequency value of F21 to the 60 MHz power supply.

Moreover, in one embodiment, when the state of the TTL signal 112 is S1, the power controller 154 restricts itself from providing the power value of P20 to the 60 MHz power supply. Also, in this embodiment, the AFT 120 restricts itself from providing the frequency value of F20 to the 60 MHz power supply.

In an embodiment, during the state S1, the power value of P11 and the frequency value of F11 are provided to the 2 MHz power supply simultaneous with the provision of the power value of P21 and the frequency value of F21 to the 60 MHz power supply. For example, in the state S1, the power value of P11 and the frequency value of F11 are provided to the 2 MHz power supply during the same clock edge of the TTL signal 112 as that during which the power value of P21 and the frequency value of F21 are provided to the 60 MHz power supply.

In one embodiment, during the state S1, the power value of P11 and the frequency value of F11 are provided to the 2 MHz power supply at almost the same time as that of the provision of the power value of P21 and the frequency value of F21 to the 60 MHz power supply. For example, in the state S1, the power value of P11 and the frequency value of F11 are provided to the 2 MHz power supply within a fraction of a second, e.g., after a few microseconds, milliseconds, nanoseconds, etc., before or after an occurrence of a clock edge of the TTL signal 112. In this example, the power value of P21 and the frequency value of F21 are provided to the 60 MHz power supply during the occurrence of the clock edge.

The 2 MHz power supply receives the frequency value of F11 and the power value of P11 during the state S1. Upon receiving the values F11 and P11, the 2 MHz power supply generates RF power at the frequency F11 and the RF power has the power value of P11. Moreover, the 60 MHz power supply receives the frequency value of F21 and the power value of P21 during the state S1. Upon receiving the values F21 and P21, the 60 MHz power supply generates RF power at the frequency F21 and the RF power has the power value of P21.

In one embodiment, an RF power supply includes a driver followed by an amplifier. The amplifier supplies forward power via a transmission line to the plasma chamber 102. For example, the amplifier of the 2 MHz power supply supplies forward power having a power value that is proportional, e.g., same as, multiple of, etc. of the power value P11 and having the frequency value F11 via a transmission line 230 and the impedance matching circuit 182 to the plasma chamber 102. As another example, the amplifier of the 60 MHz power supply supplies forward power having a power value that is proportional to the power value of P21 and having the frequency value F21 via a transmission line 232 and the impedance matching circuit 186 to the plasma chamber 102.

When the state of the TTL signal 112 is S0, no power value is provided to the 2 MHz power supply and the power controller 154 provides the power value of P20 to the 60 MHz controller. During the state S0, no frequency value is provided to the 2 MHz power supply and the AFT 120 provides the frequency value of F20 to the 60 MHz power supply.

Moreover, in one embodiment, when the state of the TTL signal 112 is S0, the power controller 142 restricts itself from providing the power value of P11 to the 2 MHz power supply and the power controller 152 restricts itself from providing the power value of P21 to the 60 MHz power supply. Also, in this embodiment, the AFT 114 restricts itself from providing the frequency value of F11 to the 2 MHz power supply and the AFT 118 restricts itself from providing the frequency value of F21 to the 60 MHz power supply.

In one embodiment, during the state S0, the lack of provision of power and frequency values to the 2 MHz power supply is performed simultaneous with the provision of the power value of P20 and the frequency value of F20 to the 60 MHz power supply. For example, in the state S1, a power value of 0 and a frequency value of 0 are provided to the 2 MHz power supply during the same clock edge of the TTL signal 112 as that during which the power value of P20 and the frequency value of F20 are provided to the 60 MHz power supply.

The 2 MHz power supply does not receive any frequency and power values, e.g., receives the frequency value of 0 and the power value of 0, during the state S0. Upon not receiving power and frequency values, the 2 MHz power supply generates RF power at a frequency of zero and RF power having a power value of zero. Moreover, the 60 MHz power supply receives the frequency value of F20 and the power value of P20 during the state S0. Upon receiving the values F20 and P20, the 60 MHz power supply generates RF power at the frequency F20 and the RF power has the power value of P20.

The amplifier of the 2 MHz power supply does not supply forward power, e.g., supplies forward power having a power value of zero and having a frequency value of zero, via the transmission line 230 and the impedance matching circuit 182 to the plasma chamber 102. The amplifier of the 60 MHz power supply supplies forward power having a power value that is proportional to the power value of P20 and having the frequency value F20 via the transmission line 232 and the impedance matching circuit 186 to the plasma chamber 102.

In one embodiment, during one or both the states S1 and S0, a sensor 210 senses reflected power, which is RF power reflected from the plasma of the plasma chamber 102, on the transmission line 230. Moreover, during one or both the states S1 and S0, the sensor 210 senses forward power on the transmission line 230 when the forward power is sent from the 2 MHz RF power supply via the transmission line 230 to the plasma chamber 102. Similarly, during one or both the states S1 and S0, a sensor 212 senses reflected power from the plasma of the plasma chamber 102. The reflected power sensed by the sensor 212 is reflected on the transmission line 232 from the plasma of the plasma chamber 102. Moreover, during one or both the states S1 and S0, the sensor 212 senses forward power on the transmission line 232 when the forward power is sent from the 60 MHz RF power supply via the transmission line 232 to the plasma chamber 102.

An analog-to-digital converter (ADC) 220 converts the reflected power signals and the forward power signals sensed by the sensor 210 from an analog form to a digital form and an ADC 222 converts the reflected power signals and the forward power signals sensed by the sensor 212 from an analog to a digital form. During one or both the states S1 and S0, the DSP 140 receives the digital value of the reflected power signal and the forward power signal sensed by the sensor 210 and the DSP 150 receives the digital value of the reflected power signal and the forward power signal sensed by the sensor 212. The DSP 140 calculates a relationship, e.g., a ratio of the digital reflected power signal and the digital forward power signal, a voltage standing wave ratio (VSWR), etc., during one or both the states S1 and S0 to generate values of gamma. A gamma value of 1 indicates a high degree of mismatch between impedances of a source and a load and a gamma value of 0 indicates a low degree of mismatch between impedances of a source and a load. Similarly, the DSP 150 calculates a relationship between the digital reflected power signal and the digital forward power signal during one or both the states S1 and S0 to generate values of gamma. The VSWR is calculated as being equal to a ratio of RC−1 and RC+1, where RC is a reflection coefficient.

A gamma value is sent from the DSP 140 to the AFT 114 during the state S1 and a gamma value is sent from the DSP 150 to the AFT 118 during the state S1. During the state S1, the AFT 114 determines a frequency value based on the value of gamma received from the DSP 140 and the AFT 118 determines a frequency value based on the value of gamma received from the DSP 150. During the state S1, the AFT 114 adjusts the frequency value of F11 based on the frequency value that is generated based on the gamma value and provides the adjusted frequency value to the 2 MHz power supply. Moreover, during the state S1, the AFT 118 adjusts the frequency value of F21 based on the frequency value that is generated based on the gamma value and provides the adjusted frequency value to the 60 MHz power supply.

Moreover, during the state S1, the power controller 142 determines a power value based on the value of gamma received from the DSP 140 and the power controller 152 determines a power value based on the value of gamma received from the DSP 150. During the state S1, the power controller 142 adjusts the power value of P11 based on the power value that is generated based on the gamma value and provides the adjusted power value to the 2 MHz power supply. Moreover, during the state S1, the power controller 152 adjusts the power value of P21 based on the power value that is generated based on the gamma value and provides the adjusted power value to the 60 MHz power supply.

During the state S1, the 2 MHz power supply generates a power signal having the adjusted frequency value received from the AFT 114 and having the adjusted power value received from the power controller 142, and supplies the power signal via the impedance matching circuit 182 to the plasma chamber 102. Similarly, during the state S1, the 60 MHz power supply generates a power signal having the adjusted frequency value received from the AFT 118 and having the adjusted power value received from the power controller 152, and supplies the power signal via the impedance matching circuit 186 to the plasma chamber 102.

Furthermore, during the state S0, there is no provision of power and frequency values to the 2 MHz power supply and there is no use of a gamma value generated during the state S0 to adjust the zero frequency and power values of the 2 MHz power supply. During the state S0, the AFT 120 determines a frequency value based on the value of gamma received from the DSP 150. During the state S0, the AFT 120 adjusts the frequency value of F20 based on the frequency value that is generated from the gamma value and provides the adjusted frequency value to the 60 MHz power supply. Moreover, during the state S0, the power controller 154 determines a power value based on the value of gamma received from the DSP 150. During the state S0, the power controller 154 adjusts the power value of P20 based on the power value that is generated based on the gamma value and provides the adjusted power value to the 60 MHz power supply. During the state S0, the 60 MHz power supply generates a power signal having the adjusted frequency value received from the AFT 120 and having the adjusted power value received from the power controller 154, and supplies the power signal via the impedance matching circuit 186 to the plasma chamber 102.

The power controller 142, the AFT 114, and the DSP 140 are parts of a generator controller 270. The generator controller 270, the ADC 220, the sensor 210, and the 2 MHz power supply are parts of a 2 MHz generator 274. Similarly, the power controller 152, the power controller 154, the AFTs 118 and 120, and the DSP 150 are parts of a generator controller 272. The generator controller 272, the ADC 222, the sensor 212, and the 60 MHz power supply are parts of a 60 MHz generator 276.

In one embodiment, the system 180 excludes the impedance matching circuits 182 and/or 186. In an embodiment, a single controller is used instead of the power controller 142 and the AFT 114, a single controller is used instead of the power controller 152 and the AFT 118, and a single controller is used instead of the power controller 154 and the AFT 120.

In the embodiment in which the 27 MHz power supply is used in addition to using the 2 and 60 MHz power supplies, a 27 MHz generator is similar to the 60 MHz generator 276 except that the 27 MHz generator includes the 27 MHz power supply instead of the 60 MHz power supply. The 27 MHz generator is coupled to the lower electrode 104 of the plasma chamber 102 via an impedance matching circuit (not shown) and a transmission line (not shown). Moreover, the 27 MHz power supply is coupled with the Tool UI 190 to receive the TTL signal 112. The 27 MHz generator includes two power controllers, two AFTs, a DSP, an ADC, a sensor, and the 27 MHz power supply.

Figure 2:
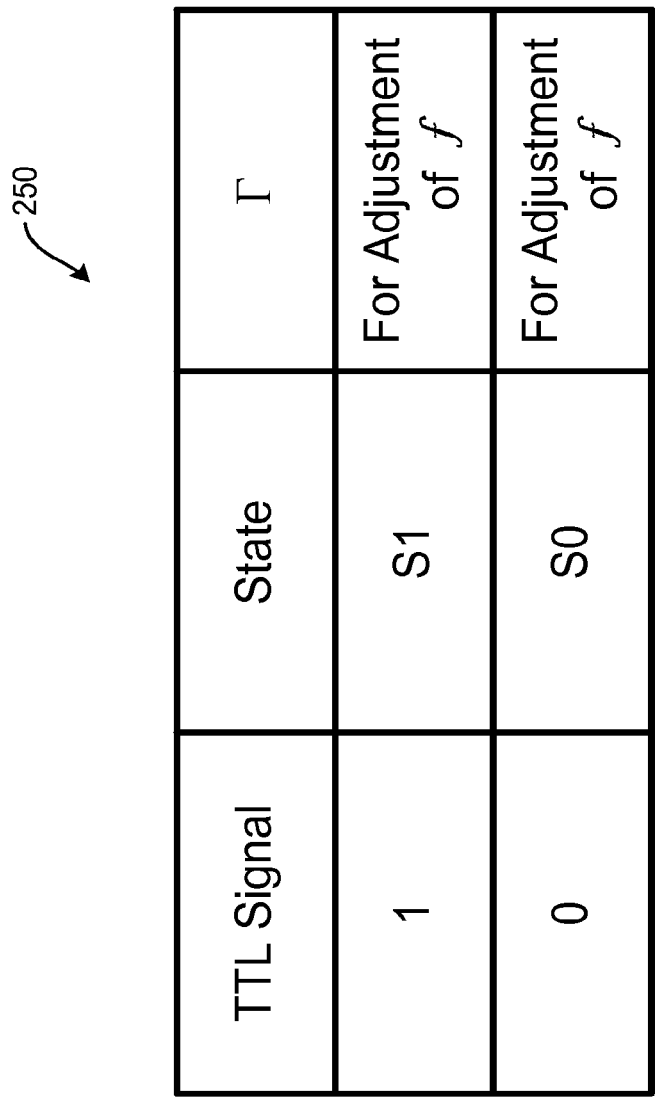
FIG. 2 is an embodiment of a table showing a change in states of radio frequency (RF) power signals with a change in states of the a transistor-transistor logic (TTL) signal and showing an adjustment in frequencies and/or power values of the power signals based on a change in gamma, in accordance with an embodiment described in the present disclosure.

FIG. 2 is an embodiment of a table 250 showing a change in states of RF power signals with a change in states of the TTL signal 112 and showing an adjustment in frequencies and/or power values of the power signals based on a change in gamma. When the TTL signal 112 is in the state S1, the power signals supplied by the 2 and 60 MHz power supplies also have the state S1. For example, the power signal supplied by the 2 MHz power supply changes it state from S1 to S0 or from S0 to S1 simultaneous with a change in state of the TTL signal 112. Also, in this example, the power signal supplied by the 60 MHz power supply changes its state from S1 to S0 or from S0 to S1 simultaneous with a change in state of the TTL signal 112. As another example, the power signal supplied by the 2 MHz power supply changes it state from S1 to S0 or from S0 to S1 at almost the same time as that during with a change in state of the TTL signal 112 occurs. Also, in this example, the power signal supplied by the 60 MHz power supply changes its state from S1 to S0 or from S0 to S1 at almost the same time as a change in state of the TTL signal 112 occurs.

Moreover, as shown in FIG. 2, during the state S1, the frequency values F11 and F21 and the power value P21 are adjusted based on a gamma value that is generated during the state S1 and during the state S0, the frequency value F20 and the power value P20 are adjusted based on a gamma value that is generated during the state S0.

Figure 3:
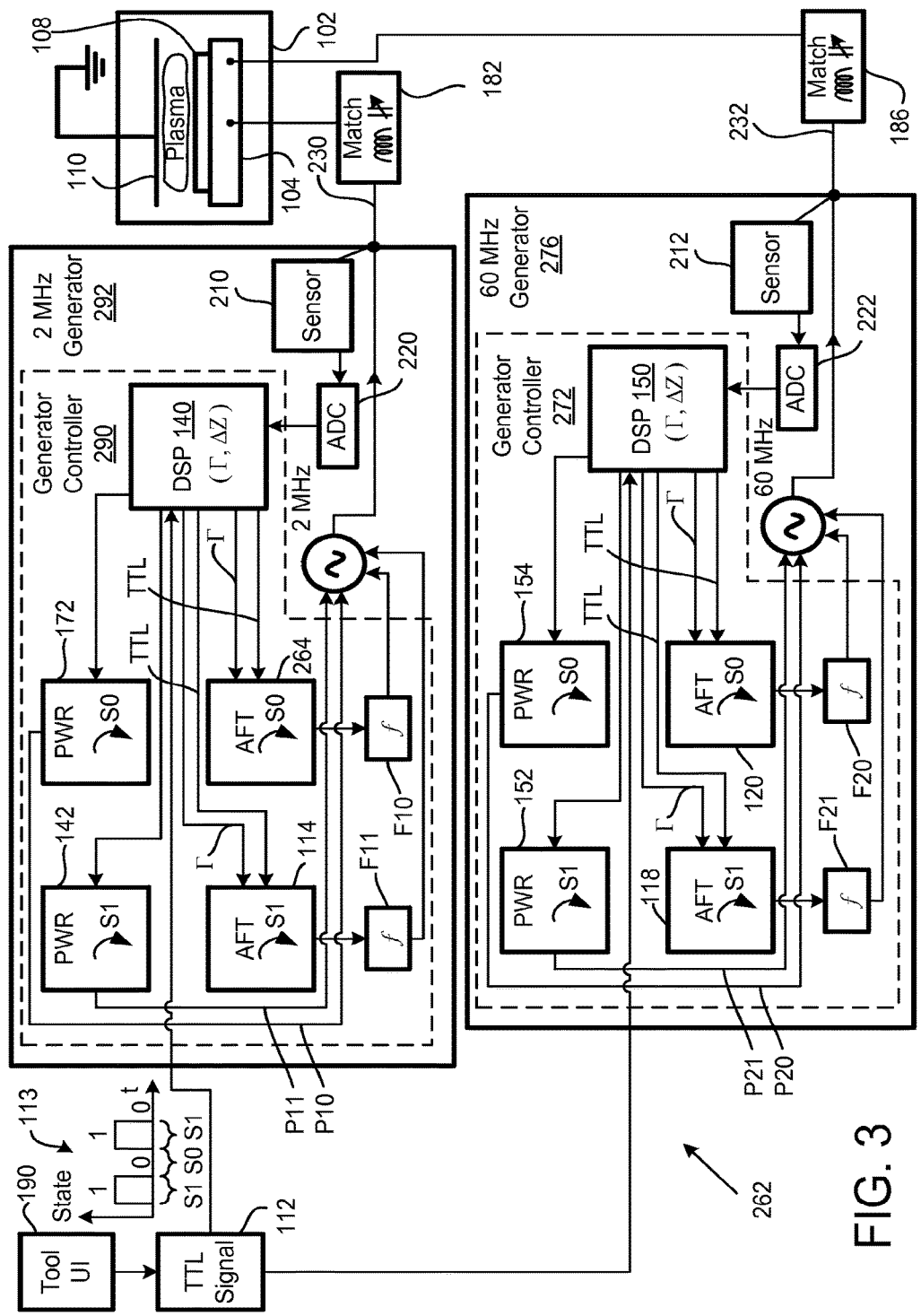
FIG. 3 is a diagram of a system for reducing an amount of time to tune power controllers and/or frequency tuners according to a change in plasma impedance, where the power controllers and/or the frequency tuners provide non-zero values, in accordance with an embodiment described in the present disclosure.

FIG. 3 is a diagram of an embodiment of a system 262 for reducing an amount of time to tune power controllers and/or frequency tuners according to a change in plasma impedance, where the power controllers and/or the frequency tuners provide non-zero values. The system 262 is similar to the system 180 of FIG. 1 except that the system 262 includes a power controller 172 and an AFT 264, each of which provide non-zero values.

The DSP 140 provides the identified state S0 from a corresponding memory location to the AFT 264 and to the power controller 172. As an example, the DSP 140 indicates to the AFT 264 and the power controller 172 that the TTL signal 112 is in the state S0 between times t2 and t3 of a duty cycle. The AFT 264 determines a frequency value based on a state of the TTL signal 112 and the power controller 172 determines a power value based on the state of the TTL signal 112. For example, the AFT 264 determines that a frequency value F10 is to be provided to the 2 MHz power supply when the state of the TTL signal 112 is S0 and the power controller 172 determines that a power value P10 is to be provided to the 2 MHz power supply when the state of the TTL signal 112 is S0. In one embodiment, the values F10 and P10 are positive values.

During the training routine, the frequency value F10 and the power value P10 are generated in a similar manner to that described above. The frequency value F10 is stored in the AFT 264 and the power value P10 is stored in the power controller 172. When the state of the TTL signal 112 is S0, the power controller 172 provides the power value of P10 to the 2 MHz power supply and the AFT 264 provides the frequency value of F10 to the 2 MHz power supply.

Moreover, in one embodiment, when the state of the TTL signal 112 is S1, the power controller 172 restricts itself from providing the power value of P10 to the 2 MHz power supply. Also, in this embodiment, the AFT 264 restricts itself from providing the frequency value of F10 to the 2 MHz power supply.

In an embodiment, during the state S0, the power value of P10 and the frequency value of F10 are provided to the 2 MHz power supply simultaneous with the provision of the power value of P20 and the frequency value of F20 to the 60 MHz power supply. For example, in the state S0, the power value of P10 and the frequency value of F10 are provided to the 2 MHz power supply during the same clock edge of the TTL signal 112 as that during which the power value of P20 and the frequency value of F20 are provided to the 60 MHz power supply.

In one embodiment, during the state S0, the power value of P10 and the frequency value of F10 are provided to the 2 MHz power supply at almost the same time as that of the provision of the power value of P20 and the frequency value of F20 to the 60 MHz power supply. For example, in the state S0, the power value of P10 and the frequency value of F10 are provided to the 2 MHz power supply within a fraction of a second before or after an occurrence of a clock edge of the TTL signal 112. In this example, the power value of P20 and the frequency value of F20 are provided to the 60 MHz power supply during the occurrence of the clock edge.

The 2 MHz power supply receives the frequency value of F10 and the power value of P10 during the state S0. Upon receiving the values F10 and P10, the 2 MHz power supply generates RF power at the frequency F10 and the RF power has the power value of P10. The amplifier of the 2 MHz power supply supplies forward power having a power value that is proportional to the power value P10 and having the frequency value F10 via the transmission line 230 and the impedance matching circuit 182 to the plasma chamber 102.

In an embodiment, during the state S0, the AFT 264 determines a frequency value based on the value of gamma received from the DSP 140. During the state S0, the AFT 264 adjusts the frequency value of F10 based on the frequency value that is generated from the gamma value and provides the adjusted frequency value to the 2 MHz power supply. Moreover, during the state S0, the power controller 172 determines a power value based on the value of gamma received from the DSP 140. During the state S0, the power controller 172 adjusts the power value of P10 based on the power value that is generated based on the gamma value and provides the adjusted power value to the 2 MHz power supply. Also, during the state S0, the 2 MHz power supply generates a power signal having the adjusted frequency value received from the AFT 264 and having the adjusted power value received from the power controller 172, and supplies the power signal via the impedance matching circuit 182 to the plasma chamber 102.

The power controllers 142 and 172, the AFTs 114 and 264, and the DSP 140 are parts of a generator controller 290. The generator controller 290, the ADC 220, the sensor 210, and the 2 MHz power supply are parts of a 2 MHz generator 292.

Figure 4A:
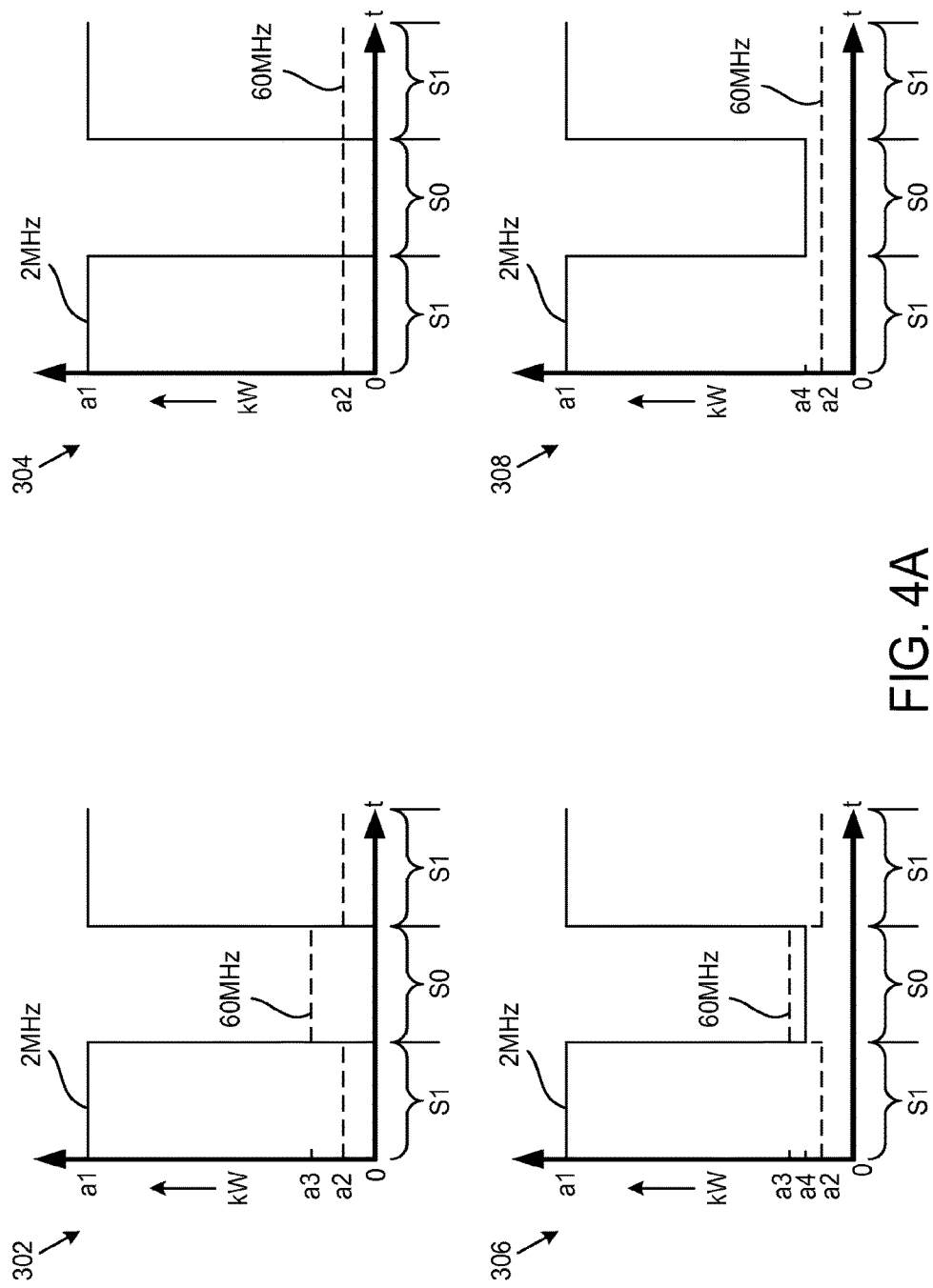
FIG. 4A shows graphs with two RF signals in which one of the RF signals has a constant value or varying values, in accordance with an embodiment described in the present disclosure.

FIG. 4A shows embodiments of graphs 302, 304, 306, and 308. Each graph 302, 304, 306, and 308 plots power values in kilowatts (kW) as a function of time t. As indicated in graph 302, a 2 MHz power signal, which is a power signal supplied by the 2 MHz power supply has a power value of a1 during the state S1 and has a power value of 0 during the state S0. The power value a1 is an example of the power value P11. Also, a 60 MHz power signal, which is a power signal supplied by the 60 MHz power supply has a power value of a2 during the state S1 and has a power value of a3 during the state S0. The power value of a2 is an example of the power value P21 and the power value of a3 is an example of the power value P20.

As indicated in the graph 304, the 60 MHz power signal has the power value a2 during states S1 and S0. Moreover, as indicated in graph 306, the 2 MHz signal has a power value of a4 during the state S0. The power value a4 is an example of the power value P10. As indicated in graph 308, the 60 MHz signal has the power value of a2 when the 2 MHz signal has the power value of a4.

Figure 4B:
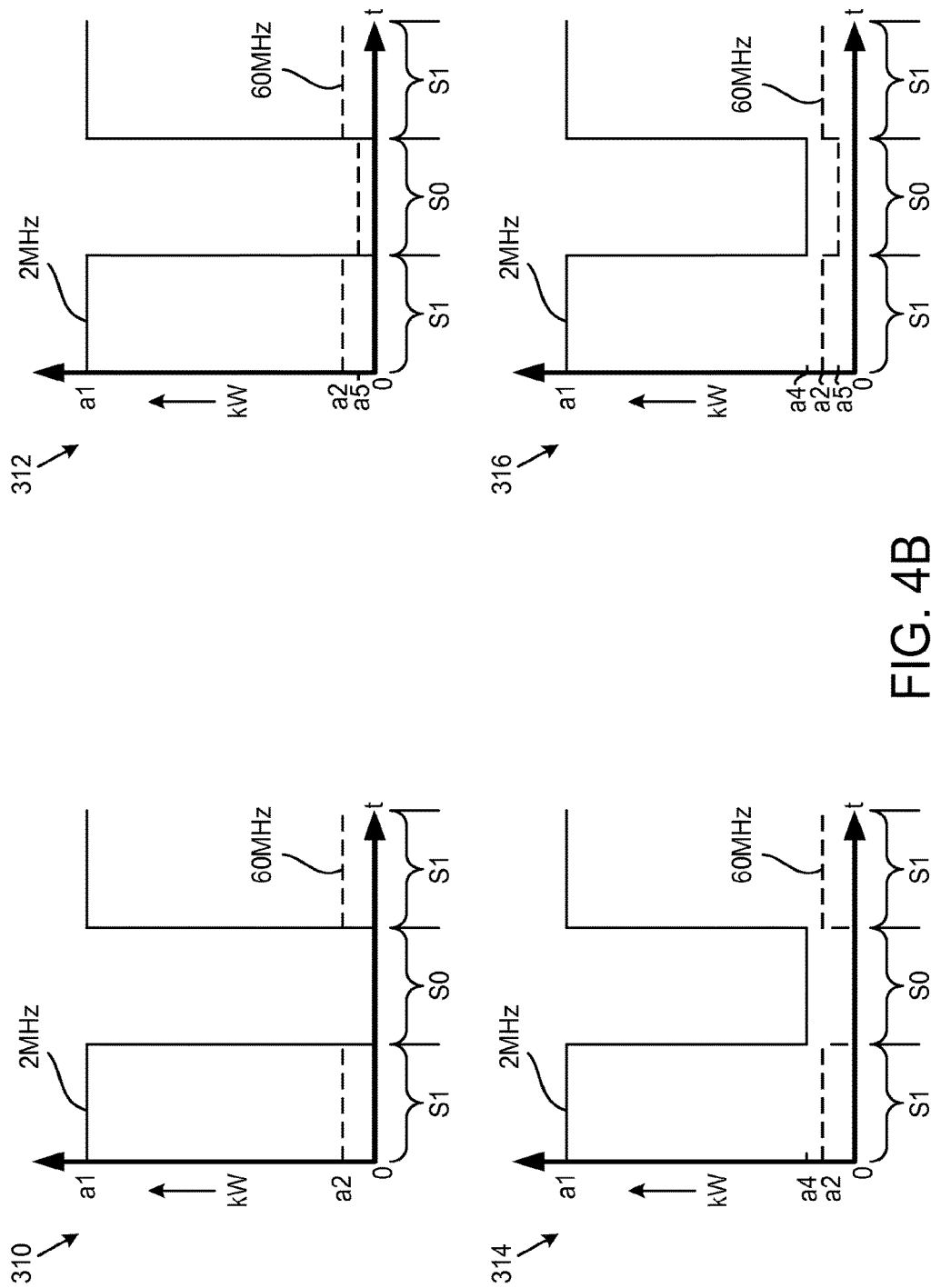
FIG. 4B shows graphs with two RF signals in which both the RF signals have varying values, in accordance with an embodiment described in the present disclosure.

FIG. 4B shows embodiments of graphs 310, 312, 314, and 316. Each graph 310, 312, 314, and 316 plots power values in kilowatts as a function of time t. As shown in graph 310, instead of the 60 MHz signal transitioning from the power value of a2 to the power value of a3 (FIG. 4A), the 60 MHz signal transitions from the power value of a2 to a power value of zero.

Moreover, as shown in graph 312, the 60 MHz signal transitions from the power value of a2 to a power value of a5, which is an example of the power value P20. As shown in graph 314, the 60 MHz signal has the power value of zero during the state S0 when the 2 MHz signal has a non-zero power value of a4. As shown in graph 316, the 60 MHz power signal has a non-zero power value of a5 during the state S0 when the 2 MHz signal has a non-zero power value of a4.

Figure 5A:
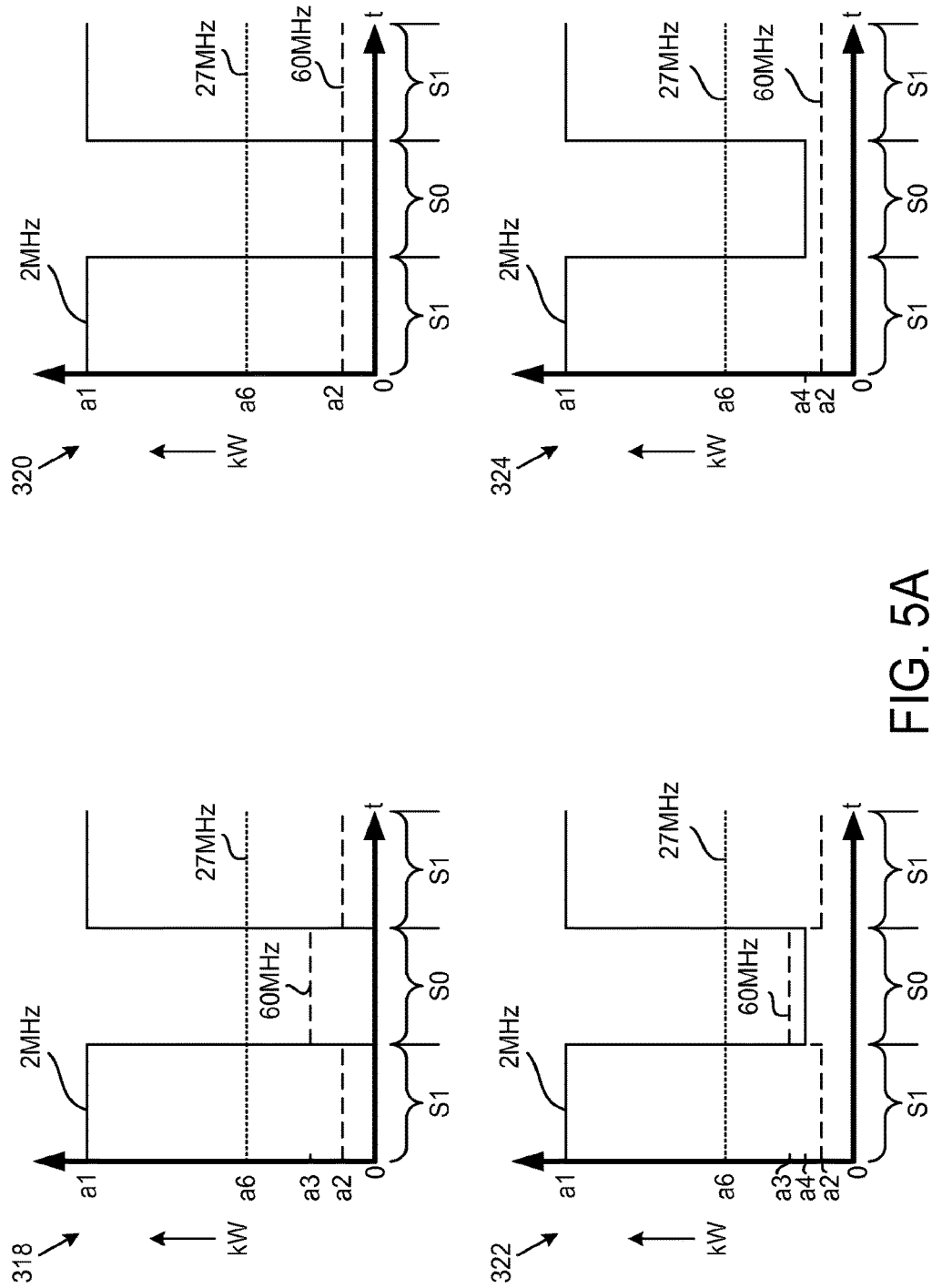
FIG. 5A shows graphs with three RF signals in which one of the RF signals has a constant value and another one of the RF signals has a constant value or varying values, in accordance with an embodiment described in the present disclosure.

FIG. 5A shows embodiments of graphs 318, 320, 322, and 324. Each graph 318, 320, 322, and 324 plots power values in kilowatts as a function of time t. Graph 318 is similar to graph 302 (FIG. 4A), graph 320 is similar to graph 304 (FIG. 4A), graph 320 is similar to graph 306 (FIG. 4A), and graph 322 is similar to graph 308 (FIG. 4A) except that the graphs 318, 320, 322, and 324 include a plot of a 27 MHz signal. The 27 MHz signal is generated from a 27 MHz power supply (not shown) of the 27 MHz generator. The 27 MHz signal is an RF signal having a power value of a6 during both states S1 and S0.

Figure 5B:
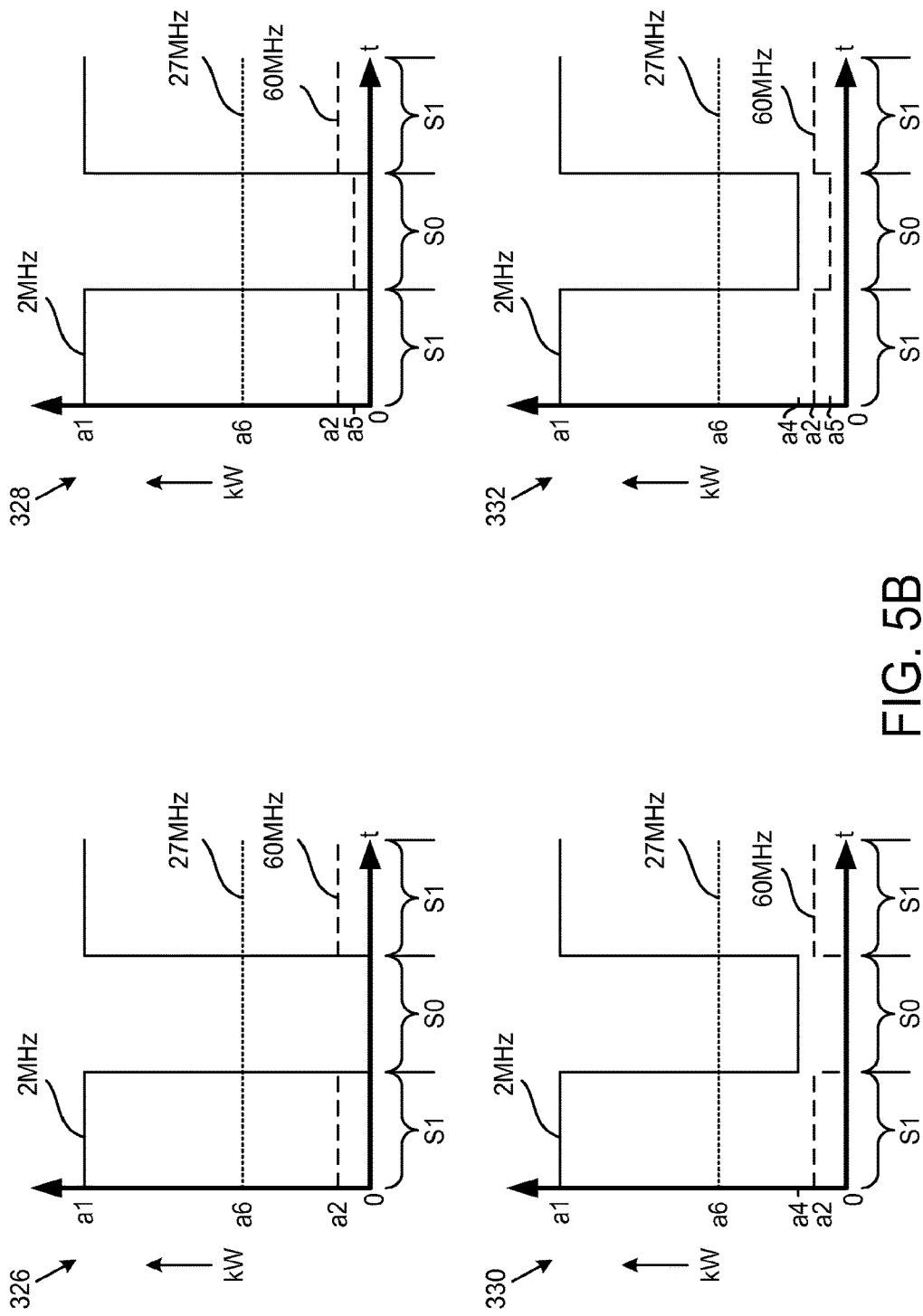
FIG. 5B shows graphs with three RF signals in which one of the RF signals a constant value and the remaining two RF signals have varying values, in accordance with an embodiment described in the present disclosure.

FIG. 5B shows embodiments of graphs 326, 328, 330, and 332. Each graph 326, 328, 330, and 332 plots power values in kilowatts as a function of time t. Graph 326 is similar to graph 310 (FIG. 4B), graph 328 is similar to graph 312 (FIG. 4B), graph 330 is similar to graph 314 (FIG. 4B), and graph 332 is similar to graph 316 (FIG. 4B) except that the graphs 326, 328, 330, and 332 include a plot of a 27 MHz signal that has the power value of a6.

Figure 5C:
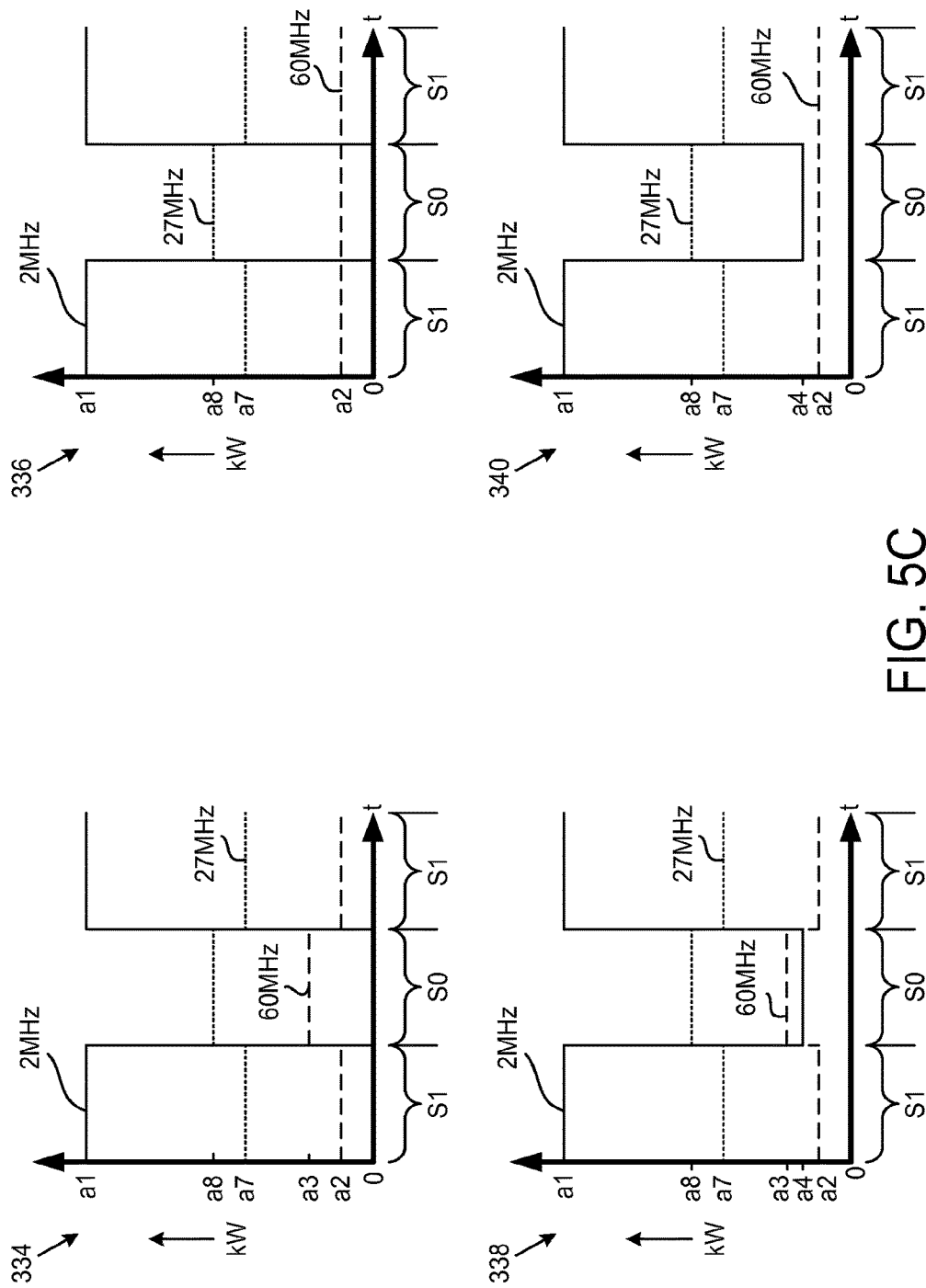
FIG. 5C shows graphs with three RF signals in which one of the RF signals has a constant value or varying values and the remaining two RF signals have varying values, in accordance with an embodiment described in the present disclosure.

FIG. 5C shows embodiments of graphs 334, 336, 338, and 340. Each graph 334, 336, 338, and 340 plots power values in kilowatts as a function of time t. Graph 334 is similar to graph 302 (FIG. 4A), graph 336 is similar to graph 304 (FIG. 4A), graph 338 is similar to graph 306 (FIG. 4A), and graph 340 is similar to graph 308 (FIG. 4A) except that the graphs 334, 336, 338, and 340 include a plot of a 27 MHz signal. The 27 MHz signal transitions from having a power value of a7 during the state S1 to having a power value of a8 during the state S0. The power value a7 is less than the power value a8.

Figure 5D:
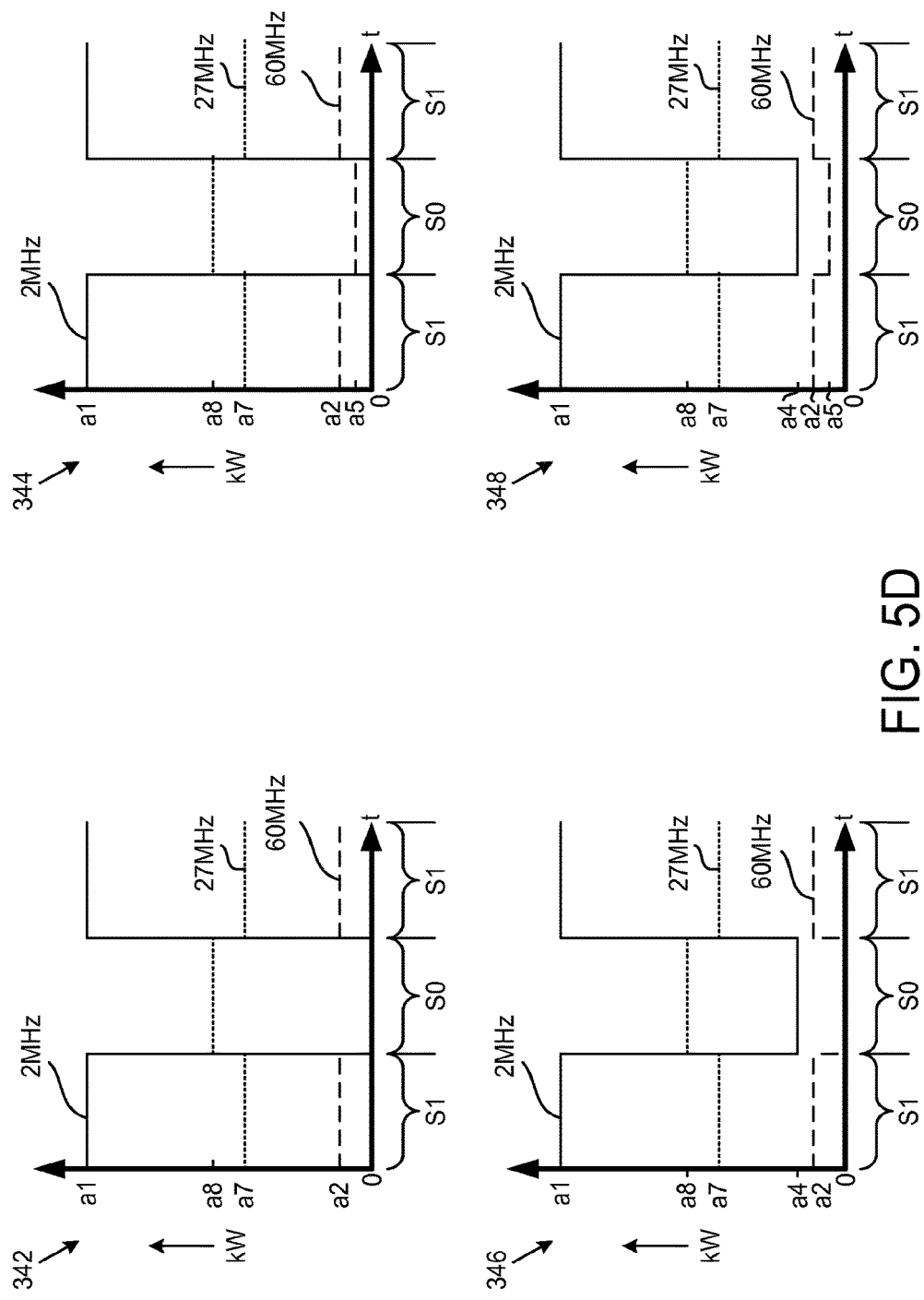
FIG. 5D shows graphs with all three RF signals have varying values, in accordance with an embodiment described in the present disclosure.

FIG. 5D shows embodiments of graphs 342, 344, 346, and 348. Each graph 342, 344, 346, and 348 plots power values in kilowatts as a function of time t. Graph 342 is similar to graph 310 (FIG. 4B), graph 344 is similar to graph 312 (FIG. 4B), graph 346 is similar to graph 314 (FIG. 4B), and graph 348 is similar to graph 316 (FIG. 4B) except that the graphs 342, 344, 346, and 348 include a plot of a 27 MHz signal that has the power values of a7 and a8.

Figure 5E:
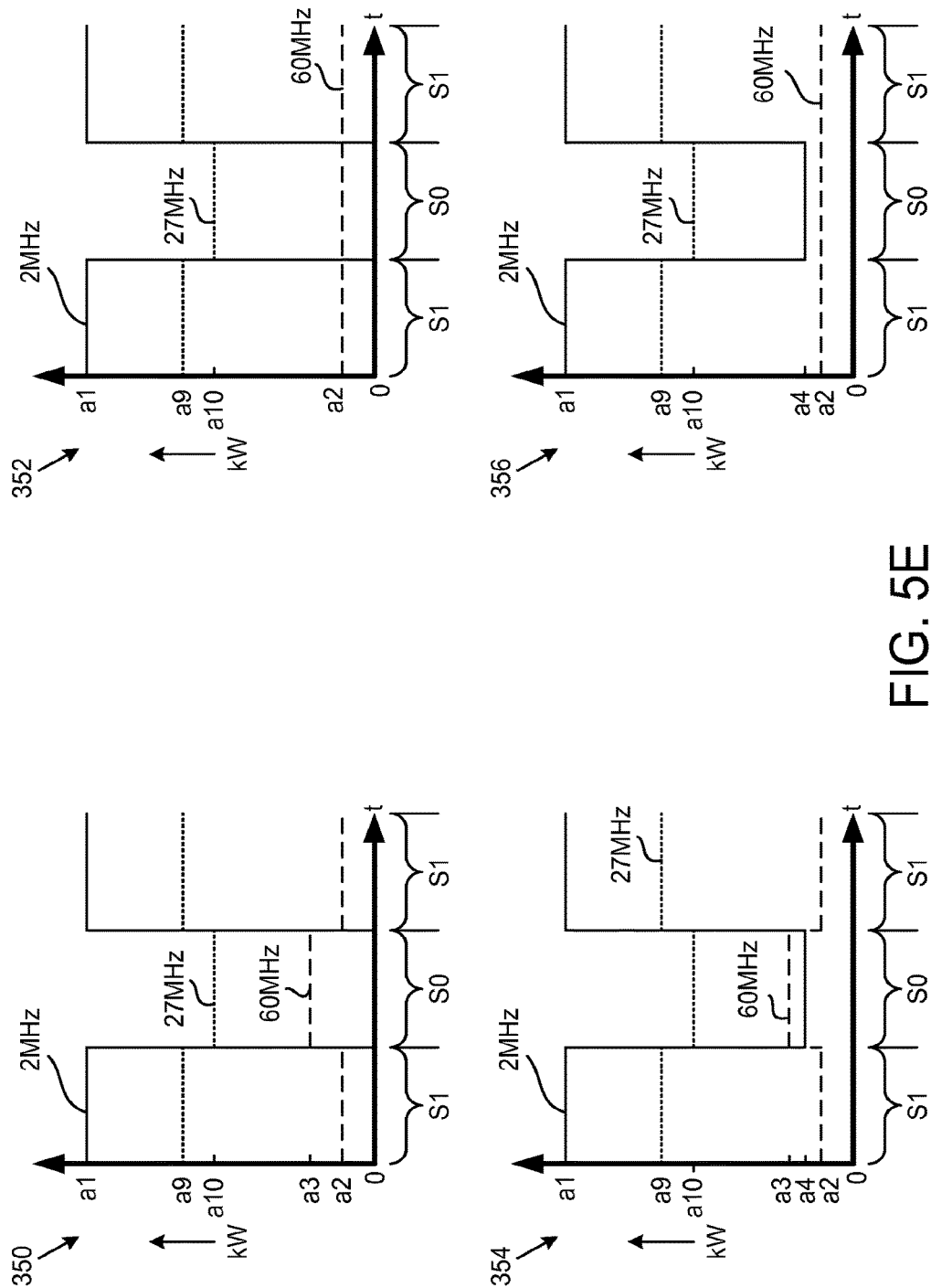
FIG. 5E shows graphs with three RF signals in which one of the RF signals has a constant value or varying values and the remaining RF signals have varying values, in accordance with an embodiment described in the present disclosure.

FIG. 5E shows embodiments of graphs 350, 352, 354, and 356. Each graph 350, 352, 354, and 356 plots power values in kilowatts as a function of time t. Graph 350 is similar to graph 302 (FIG. 4A), graph 352 is similar to graph 304 (FIG. 4A), graph 354 is similar to graph 306 (FIG. 4A), and graph 356 is similar to graph 308 (FIG. 4A) except that the graphs 350, 352, 354, and 356 include a plot of a 27 MHz signal. The 27 MHz signal transitions from having a power value of a9 during the state S1 to having a power value of a10 during the state S0. The power value a9 is greater than the power value a10.

Figure 5F:
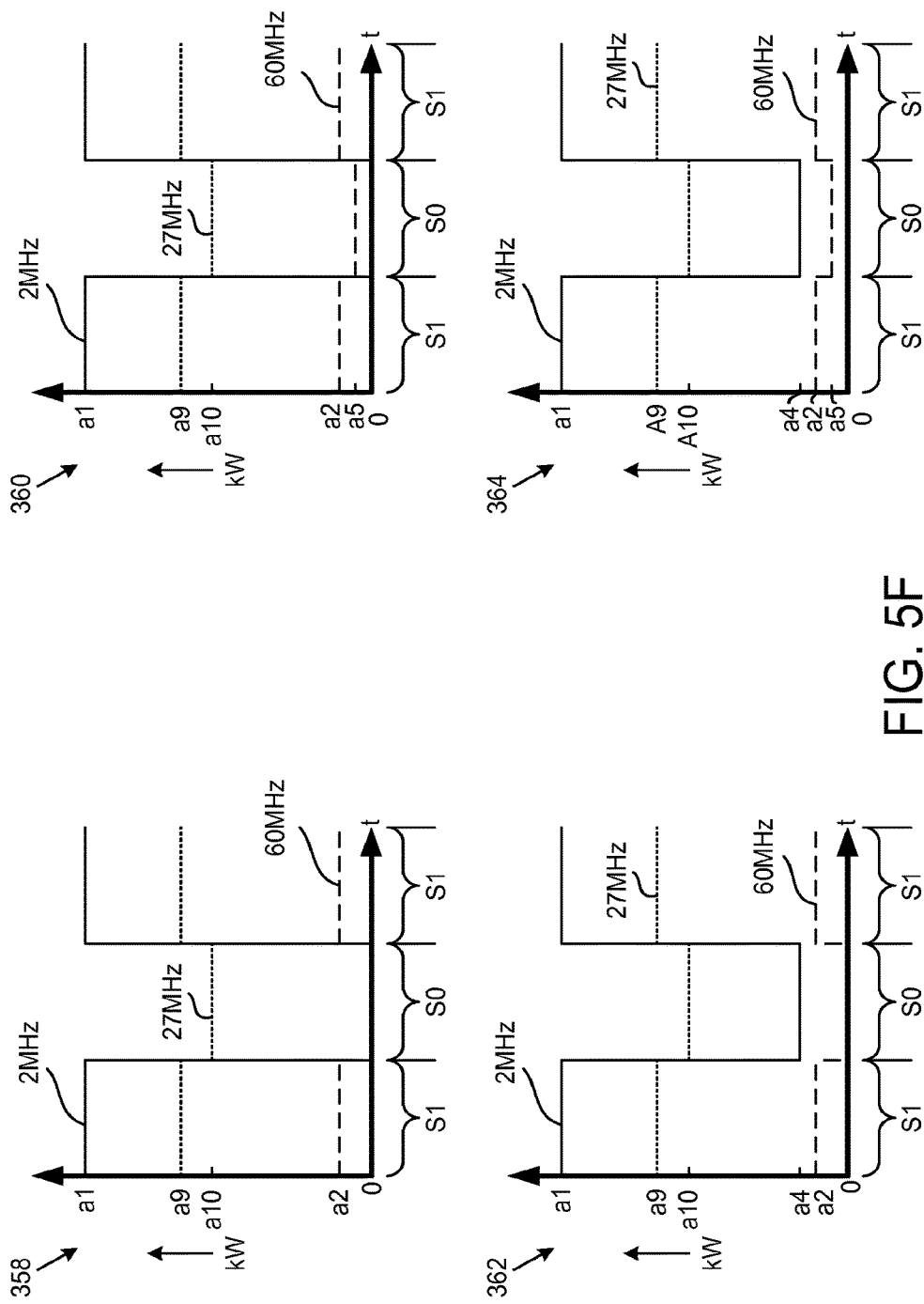
FIG. 5F shows graphs with all three RF signals have varying values, in accordance with an embodiment described in the present disclosure.

FIG. 5F shows embodiments of graphs 358, 360, 362, and 364. Each graph 358, 360, 362, and 364 plots power values in kilowatts as a function of time t. Graph 358 is similar to graph 310 (FIG. 4B), graph 360 is similar to graph 312 (FIG. 4B), graph 362 is similar to graph 314 (FIG. 4B), and graph 364 is similar to graph 316 (FIG. 4B) except that the graphs 358, 360, 362, and 364 include a plot of a 27 MHz signal that has the power values of a9 and a10.

It should be noted that in the graphs 302, 304, 306, 308, 310, 312, 314, 316, 318, 320, 322, 324, 326, 328, 330, 332, 334, 336, 338, 340, 342, 344, 346, 348, 350, 352, 354, 356, and 358 shown above, the 2 MHz signal is shown as a solid line, the 60 MHz signal is shown as a dashed line, and the 27 MHz signal is shown as a dotted line.

It is noted that in one embodiment, instead of synchronizing the states, e.g., high, low, etc., of the 2 MHz signal, the 27 MHz signal, and the 60 MHz signal with the states of the TTL signal 112, in one embodiment, the state of an RF signal, e.g., the 27 MHz signal, the 60 MHz signal, etc., is synchronized with a state of another RF signal, e.g., the 2 MHz signal, etc.

Figure 6:
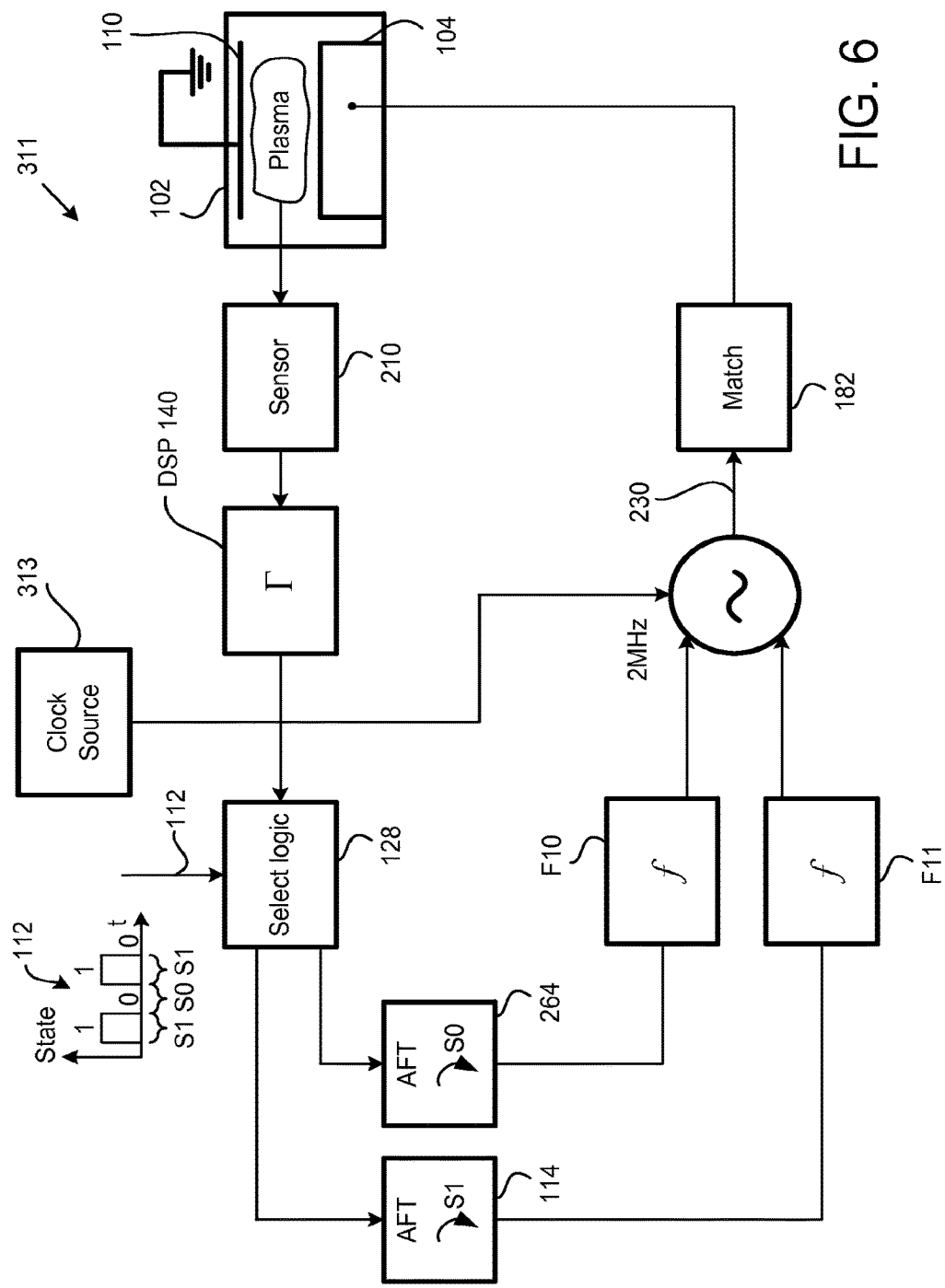
FIG. 6 is a block diagram of a system for selecting between auto frequency tuners (AFTs) based on a state of the TTL signal, in accordance with an embodiment described in the present disclosure.

FIG. 6 is a block diagram of an embodiment of a system 311 for selecting between AFTs 114 and 264 based on a state of the TTL signal 112. When the TTL signal 112 is in the state S1, a select logic 128 of the system 311 selects the AFT 114 and when the TTL signal 112 is in the state S0, the select logic 128 selects the AFT 264. Examples of the select logic 128 include a multiplexer. When the select logic 128 includes the multiplexer, the TTL signal 112 is received at select inputs of the multiplexer. For example, the low state of the TTL signal is received at a first select input of the multiplexer and a high state of the TTL signal is received at a second select input of the multiplexer. In one embodiment, the select logic 128 includes a processor. In an embodiment, the select logic 128 is implemented within the DSP 140.

When the AFT 114 is selected, the AFT 114 provides the frequency value F11 to the 2 MHz power supply. Similarly, when the AFT 264 is selected, the AFT 264 provides the frequency value F10 to the 2 MHz power supply.

The 2 MHz power supply generates the 2 MHz signal synchronous with a clock signal that is received from a clock source 313. In one embodiment, the clock signal of the clock source 313 is synchronous with the TTL signal 112. In an embodiment, the clock signal of the clock source 313 has about the same phase as that of the TTL signal 112. For example, a leading edge of the clock signal of the clock source 313 is a fraction of second behind or before a leading edge of the TTL signal 112. In one embodiment, instead of the clock signal from the clock source 313, the TTL signal 112 is provided to the 2 MHz power supply.

In the embodiment illustrated using FIG. 1, instead of the selection between the AFTs 114 and 264, during the state S1, the AFT 114 is selected and during the state S0, an AFT is not selected. For example, during the state S0, the select logic 128 does not select any AFT.

In one embodiment, the select logic 128 selects between the power controllers 142 and 172 (FIG. 3) instead of the AFTs 114 and 264. When the power controller 142 is selected during the state S1, the power controller 142 provides the power value P11 to the 2 MHz power supply and when the power controller 172 is selected ruing the state S0, the power controller 172 provides the power value P10 to the 2 MHz power supply.

Moreover, in the embodiment illustrated using FIG. 1, instead of the selection between the power controllers 142 and 172, during the state S1, the power controller 142 is selected and during the state S0, a power controller is not selected.

In an embodiment, the select logic 128 is implemented within the 60 MHz generator 276 (FIG. 1). This embodiment is similar to the embodiment described using FIG. 6 except that instead of selecting between the AFTs 114 and 264, the select logic 128 selects between the AFTs 118 and 120 (FIG. 1). When the AFT 118 is selected during the state S1, the AFT 118 provides the frequency value F21 to the 60 MHz power supply and when the AFT 120 is selected during the state S0, the AFT 120 provides the frequency value F20 to the 60 MHz power supply. Moreover, in this embodiment, the select logic 128 is implemented to select between the power controllers 152 and 154. When the power controller 152 is selected during the state S1, the power controller 152 provides the power value P21 to the 60 MHz power supply and when the power controller 154 is selected during the state S0, the power controller 154 provides the power value P20 to the 60 MHz power supply.

In one embodiment, the select logic 128 is implemented within the 27 MHz generator in a similar manner in which the select logic 128 is implemented within the 2 MHz generator 274 (FIG. 1) or 292 (FIG. 3) or the 60 MHz generator 276 (FIGS. 1 and 3).

Any value of gamma is transferred by the select logic 128 to AFT 114 or 264 based on the state S1 or S0. For example, when the state is S1, the DSP 140 provides a first gamma value to the select logic 128 and the first gamma value is determined based on reflected and forward powers measured during the state S1. In this example, the select logic 128 that has selected the AFT 114 during the state S1 transfers the first gamma value received from the DSP 140 to the AFT 114. As another example, when the state is S0, the DSP 140 provides a second gamma value to the select logic 128 and the second gamma value is determined based on reflected and forward powers measured during the state S0. In this example, the select logic 128 that has selected the AFT 264 during the state S0 transfers the second gamma value received from the DSP 140 to the AFT 264.

Similarly, in the embodiments in which the power controllers 142 and 172 (FIG. 3) are used, the select logic 128 transfers the first gamma value received from the DSP 140 to the power controller 142 during the state S1 and transfers the second gamma value received from the DSP 140 to the power controller 172. Moreover, in the embodiment in which the AFT 114 is used without using the AFT 264, the select logic 128 restricts itself from transferring the second gamma value during the state S0.

Furthermore, in the embodiment in which the select logic 128 is implemented within the 60 MHz generator 276 (FIG. 1) and is coupled to the power controllers 152 and 154, the select logic 128 transfers a third gamma value received from the DSP 150 to the power controller 152 during the state S1 and transfers a fourth gamma value received from the DSP 150 to the power controller 154 during the state S0. In this embodiment, the third gamma value is generated based on the forward and reflected powers on the transmission line 232 during the state S1. Also, in this embodiment, both the forward reflected powers are sensed by the sensor 212. In this embodiment, the fourth gamma value is generated based on the forward and reflected powers on the transmission line 232 during the state S0.

Moreover, in the embodiment in which the select logic 128 is implemented within the 60 MHz generator and is coupled to the AFTs 118 and 120, the select logic 128 transfers the third gamma value received from the DSP 150 to the AFT 118 during the state S1 and transfers the fourth gamma value received from the DSP 150 to the AFT 120 during the state S1.

Figure 7:
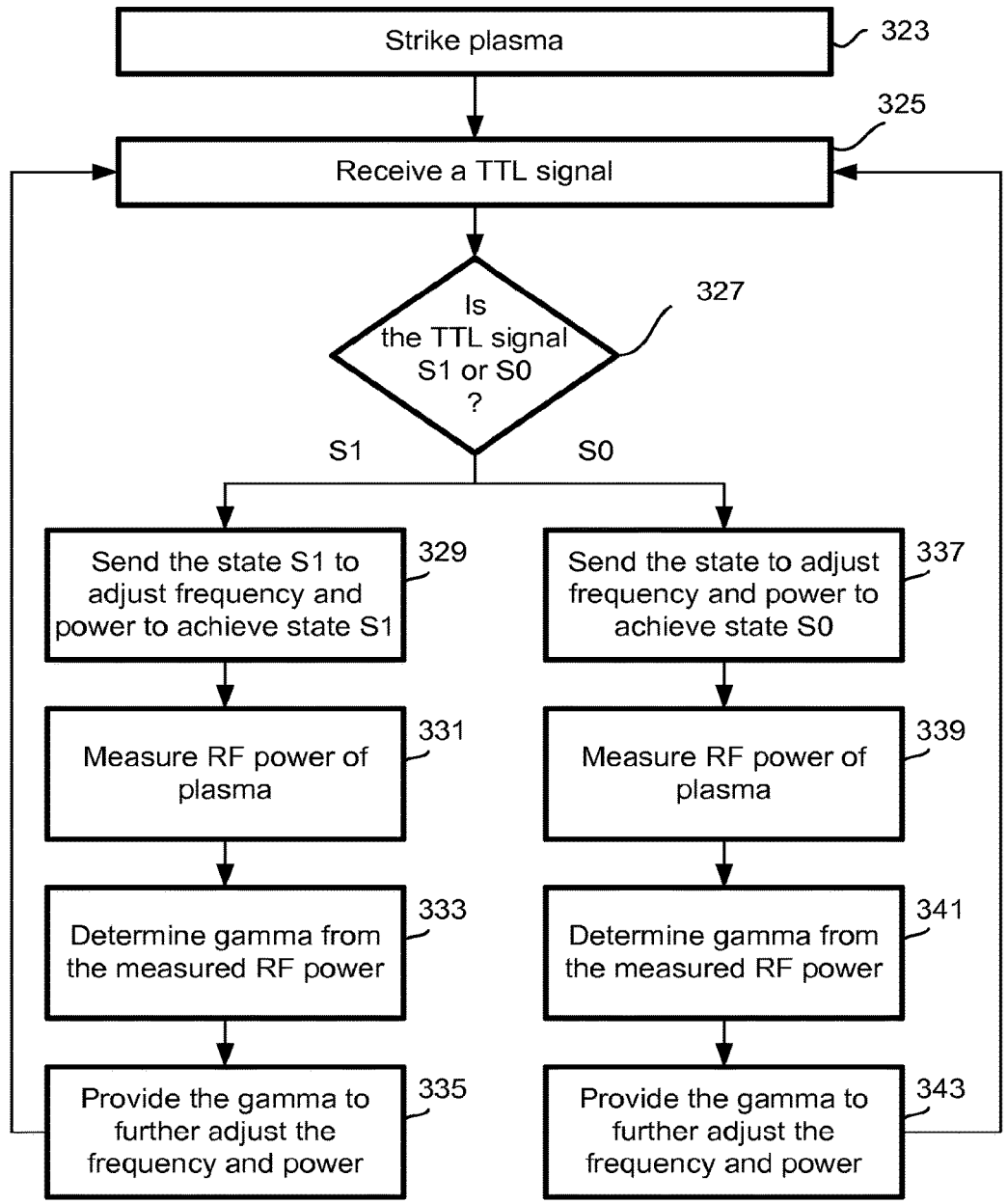
FIG. 7 is a flowchart of a method for determining whether to generate RF signals having a first set of power values and a first set of frequencies or to generate RF signals having a second set of power values and a second set of frequencies, in accordance with an embodiment described in the present disclosure.

FIG. 7 is a flowchart of an embodiment of a method 321 for determining whether to generate RF signals having a first set of power values and a first set of frequencies or to generate RF signals having a second set of power values and a second set of frequencies. In an operation 323, plasma is struck, e.g., generated, within the plasma chamber 102 (FIG. 1). Also, in an operation 325, the TTL signal 112 is received by a 2 MHz generator, e.g., the generator 274 (FIG. 1), the generator 292 (FIG. 3), etc., and is received by the 60 MHz generator 276 (FIGS. 1 and 3). For example, the DSP 140 (FIG. 1) receives the TTL signal 112 from the tool UI 190 and the DSP 150 (FIG. 1) receives the TTL signal 112 from the tool UI 190.

In an operation 327, a DSP, e.g., the DSP 140, DSP 150, etc., determines whether a state of the TTL signal 112 is S1 or S0. For example, the DSP 140 determines whether a state of the TTL signal 112 is high or low. As another example, the DSP 150 determines whether a state of the TTL signal 112 is 1 or 0.

In response to determining that the state of the TTL signal 112 is S1, in an operation 329, the TTL signal 112, is sent by a DSP, e.g., the DSP 140, DSP 150, etc., to a corresponding AFT or power controller, e.g., AFT 114, AFT 118, power controller 142, power controller 152, etc. to achieve the state S1. For example, the identification of the state S1 is sent from the DSP 140 to the AFT 114 and to the power controller 142 to achieve the power value P11 and the frequency value F11 to further achieve the state S1. In this example, the AFT 114 provides the frequency value F11 based on a first look-up table that includes the state S1 corresponding to the frequency value F11. Moreover, in this example, the power controller 142 provides the power value P11 based on a second look-up table that includes the state S1 corresponding to the power value P11. In this example, the first look-up table is stored within the AFT 114 and the second look-up table is stored within the power controller 142.

As another example, the state S1 is sent from the DSP 150 to the AFT 118 and to the power controller 152 to achieve the power value P21 and the frequency value F21 to achieve the state S1. In this example, the AFT 118 provides the frequency value F21 based on a third look-up table that includes the state S1 corresponding to the frequency value F21. Moreover, in this example, the power controller 152 provides the power value P21 based on a fourth look-up table that includes the state S1 corresponding to the power value P21. In this example, the third look-up table is stored within the AFT 118 and the fourth look-up table is stored within the power controller 152.

In an operation 331, reflected power, which is RF power reflected from plasma within the plasma chamber 102, and forward power are measured on the transmission line 230 (FIG. 1). The reflected and forward powers are measured by the sensor 210 (FIG. 1). Measured analog values of the forward power and reflected power are provided by the sensor 210 to the ADC 220, which converts the analog values into digital values. Moreover, in the operation 331, reflected power and forward power are measured on the transmission line 232 (FIG. 1). The reflected and forward powers are measured by the sensor 212 (FIG. 1). Measured analog values of the forward power and reflected power are provided by the sensor 212 to the ADC 222, which converts the analog values into digital values In an operation 333, the DSP 140 receives the digital values of the forward and reflected powers measured by the sensor 210 and determines gamma from the values. Also, in the operation 333, the DSP 150 receives the digital values of the forward and reflected powers measured by the sensor 212 and determines gamma from the values.

In an operation 335, the gamma is provided by the DSP 140 to the AFT 114 to adjust the frequency value F11 and is provided by the DSP 140 to the power controller 142 to adjust the power value P11. As an example, the AFT 114 retrieves a frequency value, other than the frequency value F11, from a look-up table corresponding to the gamma that is measured based on signals on the transmission line 230 for the state S1 and provides the other frequency value to the 2 MHz power supply. The 2 MHz power supply generates an RF signal having the other frequency value. Moreover, in the operation 335, the gamma is provided by the DSP 140 to the power controller 142 to adjust the power value P11. As an example, the power controller 142 retrieves a power value, other than the power value P11, from a look-up table corresponding to the gamma that is measured based on signals on the transmission line 230 for the state S1 and provides the other power value to the 2 MHz power supply. The 2 MHz power supply generates an RF signal having the other power value.

Moreover, in the operation 335, the gamma is provided by the DSP 150 to the AFT 118 to adjust the frequency value F21 and is provided by the DSP 150 to the power controller 152 to adjust the power value P21. As an example, the AFT 118 retrieves a frequency value, other than the frequency value F21, from a look-up table corresponding to the gamma that is measured based on signals on the transmission line 232 for the state S1 and provides the other frequency value to the 60 MHz power supply. The 60 MHz power supply generates an RF signal having the other frequency value. As another example, the power controller 152 retrieves a power value, other than the power value P21, from a look-up table corresponding to the gamma that is measured based on signals on the transmission line 232 for the state S1 and provides the other power value to the 60 MHz power supply. The 60 MHz power supply generates an RF signal having the other power value. The method 321 repeats the operation 325 after the operation 335.

In response to determining that the state of the TTL signal 112 is S0, in an operation 337, the TTL signal 112, is sent by a DSP, e.g., the DSP 140, DSP 150, etc., to a corresponding AFT or power controller, e.g., AFT 264, AFT 120, power controller 172, power controller 154, etc. to achieve the state S0. For example, the identification of the state S0 is sent from the DSP 140 to the AFT 264 and to the power controller 172 to achieve the power value P10 and the frequency value F10 to further achieve the state S0. In this example, the AFT 264 provides the frequency value F10 based on a fifth look-up table that includes the state S0 corresponding to the frequency value F10. Moreover, in this example, the power controller 172 provides the power value P10 based on a sixth look-up table that includes the state S0 corresponding to the power value P10. In this example, the fifth look-up table is stored within the AFT 264 and the sixth look-up table is stored within the power controller 172.

As another example, the identification of the state S0 is sent from the DSP 150 to the AFT 120 and to the power controller 154 to achieve the power value P20 and the frequency value F20 to achieve the state S0. In this example, the AFT 120 provides the frequency value F20 based on a seventh look-up table that includes the state S0 corresponding to the frequency value F20. Moreover, in this example, the power controller 154 provides the power value P20 based on an eighth look-up table that includes the state S0 corresponding to the power value P20. In this example, the seventh look-up table is stored within the AFT 120 and the eighth look-up table is stored within the power controller 154.

An operation 339 is the same as the operation 331 and the operation 341 is the same as the operation 333. In an operation 343, the gamma is provided by the DSP 140 to the AFT 264 to adjust the frequency value F10 and is provided by the DSP 140 to the power controller 172 to adjust the power value P10. As an example, the AFT 264 retrieves a frequency value, other than the frequency value F10, from a look-up table corresponding to the gamma that is measured based on signals on the transmission line 230 for the state S0 and provides the other frequency value to the 2 MHz power supply. The 2 MHz power supply generates an RF signal having the other frequency value. Moreover, in the operation 343, the gamma is provided by the DSP 140 to the power controller 172 to adjust the power value P10. As an example, the power controller 172 retrieves a power value, other than the power value P10, from a look-up table corresponding to the gamma that is measured based on signals on the transmission line 230 for the state S0 and provides the other power value to the 2 MHz power supply. The 2 MHz power supply generates an RF signal having the other power value.

Moreover, in the operation 343, the gamma is provided by the DSP 150 to the AFT 120 to adjust the frequency value F20 and is provided by the DSP 150 to the power controller 154 to adjust the power value P20. As an example, the AFT 120 retrieves a frequency value, other than the frequency value F20, from a look-up table corresponding to the gamma that is measured based on signals on the transmission line 232 for the state S0 and provides the other frequency value to the 60 MHz power supply. The 60 MHz power supply generates an RF signal having the other frequency value. Moreover, in the operation 343, the gamma is provided by the DSP 150 to the power controller 154 to adjust the power value P20. As an example, the power controller 154 retrieves a power value, other than the power value P20, from a look-up table corresponding to the gamma that is measured based on signals on the transmission line 232 for the state S0 and provides the other power value to the 60 MHz power supply. The 60 MHz power supply generates an RF signal having the other power value. The method 321 repeats the operation 325 after the operation 343.

In one embodiment, the operations 331, 333, 335, 339, 341, and 343 are optional. For example, the operation 325 is repeated after the operations 329 and 337 and the operations 331, 333, 335, 339, 341, and 343 are not performed.

It should be noted that although the above-described embodiments relate to providing the 2 MHz RF signal and/or 60 MHz signal and/or 27 MHz signal to the lower electrode 104 and grounding the upper electrode 110, in several embodiments, the 2 MHz, 60 MHz, and 27 MHz signals are provided to the upper electrode 110 while the lower electrode 104 is grounded.

It is further noted that in an embodiment, a change in impedance of the plasma is not used to generate the states S1 and S0 of the TTL signal 112. The states S1 and S0 are independent of the change in the impedance of plasma.

It is also noted that in one embodiment, an input, e.g., frequency input, power input, etc., or a level, e.g., power level, frequency level, includes one or more values that are within a threshold of another value. For example, a power level includes the power value P21 and other power values that are within the threshold of the power value P21. In this example, the power level excludes any power values for another state, e.g., power value P20 for state S0. As another example, a frequency input includes the frequency value F11 and other frequency values that are within the threshold of the frequency value F11. In this example, the frequency input excludes any frequency values for another state, e.g., frequency value F10 for state S0.

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the 2 MHz and the 60 MHz power supplies are coupled to an inductor within the ICP plasma chamber.

In one embodiment, the operations performed by an AFT and/or a power controller of a generator controller are performed by a DSP of the generator controller. For example, the operations, described herein, as performed by the AFT 118 and 120 are performed by the DSP 150 (FIG. 3). As another example, the operations, described herein, as performed by the AFT 114, the AFT 264, the power controller 142, and the power controller 172 are performed by the DSP 140 (FIG. 3).

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A system comprising:
a primary generator for coupling to an electrode, wherein the primary generator includes a primary power supply for supplying a primary radio frequency (RF) signal to the electrode, wherein the primary generator further includes a primary automatic frequency control (AFC) to provide a primary frequency input to the primary power supply when a pulsed signal is in a first state, wherein the primary AFC of is coupled to the primary power supply;
a secondary generator for coupling to the electrode, wherein the secondary generator includes a secondary power supply for supplying a secondary RF signal to the electrode, wherein the secondary generator includes a first secondary AFC to provide a first secondary frequency input to the secondary power supply when the pulsed signal is in the first state, wherein the secondary generator includes a second secondary AFC to provide a second secondary frequency input to the secondary power supply when the pulsed signal is in a second state, wherein the first and second secondary AFCs are coupled to the secondary power supply, wherein the first secondary and second secondary frequency inputs are provided to the secondary power supply to generate the secondary RF signal that is pulsed between a first secondary frequency level and a second secondary frequency level, wherein the secondary power supply pulses the secondary RF signal between the first secondary and the second secondary frequency levels without waiting for a change in the primary frequency input, wherein the first secondary frequency level is different from the second secondary frequency level; and
a digital pulsing source for generating the pulsed signal, wherein the digital pulsing source is coupled to the primary generator and the secondary generator.

2. The system of claim 1, wherein the secondary generator includes a selector coupled between the digital pulsing source and the first and second secondary AFCs to select between the first secondary AFC and the second secondary AFC for providing the first secondary frequency input or the second secondary frequency input to the secondary power supply, wherein the selector is configured to select between the first secondary AFC and the second secondary AFC based on the first and second states of the pulsed signal, wherein the selector is coupled to the digital pulsing source and to the first and second secondary AFCs.

3. The system of claim 1,
wherein the primary RF signal is at a first power level when the pulsed signal is in the first state and is at a second power level when the pulsed signal is in the second state, wherein the first power level is greater than the second power level,
wherein the secondary RF signal is at a third power level when the pulsed signal is in the first state and at a fourth power level when the pulsed signal is in the second state, wherein the third power level is greater than the fourth power level.

4. The system of claim 1, wherein during a cycle of repetition of the pulsed signal, the secondary RF signal has the first secondary frequency level for a predetermined duty cycle of the cycle of repetition and has the second secondary frequency for a remaining time period of the cycle of repetition.

5. A system comprising:
a plasma chamber including a lower electrode with a surface for supporting a substrate and an upper electrode disposed over the lower electrode, wherein the upper electrode is electrically grounded;
a primary generator for coupling to the lower electrode, wherein the primary generator includes a primary power supply for supplying a primary radio frequency (RF) signal to the lower electrode;
a secondary generator for coupling to the lower electrode, wherein the secondary generator includes a secondary power supply for supplying a secondary RF signal to the lower electrode; and
a digital pulsing source configured to generate a pulsed signal, wherein the digital pulsing source is coupled to the primary generator and the secondary generator, wherein the pulsed signal transitions between two states including a first state and a second state,
wherein the primary generator includes a primary automatic frequency control (AFC) to provide a primary frequency input to the primary power supply when the pulsed signal is in the first state, wherein the primary AFC is coupled to the primary power supply,
wherein the secondary generator includes a first secondary AFC to provide a first secondary frequency input to the secondary power supply when the pulsed signal is in the first state, wherein the first secondary AFC is coupled to the secondary power supply,
wherein the secondary generator includes a second secondary AFC to provide a second secondary frequency input to the secondary power supply when the pulsed signal is in the second state, wherein the second secondary AFC is coupled to the secondary power supply,
wherein the first secondary and second secondary frequency inputs are provided to the secondary power supply to generate the secondary RF signal that is pulsed between a first secondary frequency level and a second secondary frequency level, wherein the secondary power supply pulses the secondary RF signal between the first secondary and the second secondary frequency levels without waiting for a change in the primary frequency input, wherein the first secondary frequency level is different from the second secondary frequency level.

6. The system of claim 5, further comprising a selector coupled between the digital pulsing source and the first secondary and second secondary AFCs to select between the first secondary AFC and the second secondary AFC for providing the first secondary frequency input or the second secondary frequency input to the secondary power supply, wherein the selector is configured to select between the first secondary AFC and the second secondary AFC based on the states of the pulsed signal, wherein the selector is coupled to the digital pulsing source and to the first secondary and second secondary AFCs.

7. The system of claim 6, wherein the selector includes a multiplexer.

8. The system of claim 5, wherein the first state is an on state and the second state is an off state.

9. The system of claim 5, wherein the primary RF signal has a lower frequency than the secondary RF signal.

10. The system of claim 5,
wherein the primary RF signal is at a first power level when the pulsed signal is in the first state and is at a second power level when the pulsed signal is in the second state, wherein the first power level is greater than the second power level,
wherein the secondary RF signal is at a third power level when the pulsed signal is in the first state and at a fourth power level when the pulsed signal is in the second state, wherein the third power level is greater than the fourth power level.

11. The system of claim 5, wherein the digital pulsing source includes a clock oscillator or a transistor-transistor logic (TTL), wherein the primary frequency input is different from the first secondary frequency input and the second secondary frequency input.

12. A system comprising:
a digital pulsing source for generating a pulsed signal;
a primary generator including:
  a primary power supply for coupling to an electrode for supplying a primary radio frequency (RF) signal to the electrode;
  a primary processor coupled to the digital pulsing source for receiving the pulsed signal, wherein the primary processor is configured to identify a first state of two states of the pulsed signal and a second state of the two states;
  a primary power controller coupled to the primary processor to provide a primary power value to the primary power supply when the pulsed signal is in the first state; and
  a primary automatic frequency control (AFC) coupled to the primary processor to receive the state identification from the primary processor, wherein the primary AFC is configured to provide a primary frequency input of the primary RF signal to the primary power supply when the pulsed signal is in the first state; and
a secondary generator including:
  a secondary power supply for coupling to the electrode to supply a secondary RF signal to the electrode;
  a secondary processor coupled to the digital pulsing source for receiving the pulsed signal to identify whether the pulsed signal is in the first state or the second state;
  a first secondary power controller coupled to the secondary processor to provide a first secondary power value to the secondary power supply when the pulsed signal is in the first state;
  a second secondary power controller coupled to the secondary processor to provide a second secondary power value to the secondary power supply when the pulsed signal is in the second state;
  a first secondary AFC coupled to the secondary processor to receive the state identification from the secondary processor, wherein the first secondary AFC is configured to provide a first secondary frequency input of the secondary RF signal to the secondary power supply when the pulsed signal is in the first state; and
  a second secondary AFC coupled to the secondary processor to receive the state identification from the secondary processor, wherein the second secondary AFC is configured to provide a second secondary frequency input of the secondary RF signal to the secondary power supply when the pulsed signal is in the second state, wherein the first and second secondary frequency inputs are provided to the secondary power supply to generate the secondary RF signal that is pulsed between a first secondary frequency level and a secondary second frequency level, wherein the secondary power supply pulses the secondary RF signal between the first secondary and the second secondary frequency levels without waiting for a change in the primary frequency input, wherein the first secondary frequency level is different from the second secondary frequency level.

13. The system of claim 12, wherein the secondary generator includes a selector coupled between the digital pulsing source and the first and second secondary AFCs to select between the first secondary AFC and the second secondary AFC for providing the first secondary frequency input or the second secondary frequency input to the secondary power supply, wherein the selector is configured to select between the first secondary AFC and the second secondary AFC based on the states of the pulsed signal, wherein the selector is coupled to the digital pulsing source and to the first and second secondary AFCs.

14. A system comprising:
a plasma chamber including a lower electrode with a surface for supporting a substrate and an upper electrode disposed over the lower electrode, wherein the upper electrode is electrically grounded;
a digital pulsing source for generating a pulsed signal, wherein the pulsed signal transitions between two states;
a primary generator including:
  a primary power supply for coupling to the lower electrode to supply a primary radio frequency (RF) signal to the lower electrode;
  a primary processor coupled to the digital pulsing source for receiving the pulsed signal, wherein the primary processor is configured to identify a first state of the two states and a second state of the two states of the pulsed signal;

a primary power controller coupled to the primary processor to provide a primary power value to the primary power supply when the pulsed signal is in the first state; and a primary automatic frequency control (AFC) coupled to the primary processor to receive the state identification from the primary processor, wherein the primary AFC is configured to provide a primary frequency input of the primary RF signal to the primary power supply when the pulsed signal is in the first state; and a secondary generator including:

a secondary power supply for coupling to the lower electrode to supply a secondary RF signal to the lower electrode;

a secondary processor coupled to the digital pulsing source for receiving the pulsed signal to identify whether the pulsed signal is in the first state or the second state;

a first secondary power controller coupled to the secondary processor to provide a first secondary power value to the secondary power supply when the pulsed signal is in the first state;

a second secondary power controller coupled to the secondary processor to provide a second secondary power value to the secondary power supply when the pulsed signal is in the second state;

a first secondary AFC coupled to the secondary processor to receive the state identification from the secondary processor, wherein the first secondary AFC is configured to provide a first secondary frequency of the secondary RF signal to the secondary power supply when the pulsed signal is in the first state; and a second secondary AFC coupled to the secondary processor to receive the state identification from the secondary processor, wherein the second secondary AFC is configured to provide a second secondary frequency of the secondary RF signal to the secondary power supply when the pulsed signal is in the second state, wherein the first and second secondary frequencies are provided to the secondary power supply to generate the secondary RF signal that is pulsed between a first secondary frequency level and a second secondary frequency level, wherein the secondary power supply pulses the secondary RF signal between the first secondary and the second secondary frequency levels without waiting for a change in the primary frequency input, wherein the first secondary frequency level is different from the second secondary frequency level.

15. The system of claim 14, wherein the first state is an on state and the second state is an off state.

16. The system of claim 14,
wherein the primary RF signal is at a first primary power level when the pulsed signal is in the first state and is at a second primary power level when the pulsed signal is in the second state, wherein the first primary power level is greater than the second primary power level,
wherein the first secondary power value is greater than the second secondary power value.

* * * * *